United States Patent [19]
Taguchi et al.

[11] Patent Number: 5,161,211
[45] Date of Patent: Nov. 3, 1992

[54] METHOD AND SYSTEM OF SPECIFICATION PROCESSING

[75] Inventors: Kouichi Taguchi, Ashigarakami; Shinichi Yamada, Kawasaki, both of Japan

[73] Assignee: Hitachi, Ltd., Tokyo, Japan

[21] Appl. No.: 422,039

[22] Filed: Oct. 16, 1989

[30] Foreign Application Priority Data

Oct. 19, 1988 [JP] Japan .................. 63-261495

[51] Int. Cl.⁵ .................. G06F 15/18; G06F 15/46
[52] U.S. Cl. .................. 395/10; 364/138; 364/DIG. 1
[58] Field of Search .............. 395/10; 364/138, 200

[56] References Cited

U.S. PATENT DOCUMENTS

| | | | |
|---|---|---|---|
| 4,591,983 | 5/1986 | Bennett et al. | 364/468 |
| 4,704,695 | 11/1987 | Kimura et al. | 364/513 |
| 4,783,752 | 11/1988 | Kaplan et al. | 364/513 |
| 4,819,233 | 4/1989 | DeLucia et al. | 364/200 |
| 4,837,689 | 6/1989 | Tanaka et al. | 364/900 |
| 4,845,634 | 7/1989 | Vitek et al. | 364/189 |
| 4,853,873 | 8/1989 | Tsuji et al. | 364/513 |
| 4,860,204 | 8/1989 | Gendron et al. | 364/513 |
| 4,891,766 | 1/1990 | Derr et al. | 364/513 |
| 4,916,637 | 4/1990 | Allen et al. | 364/513 |
| 4,931,950 | 6/1990 | Isle et al. | 364/513 |
| 4,935,876 | 6/1990 | Hanatsuka | 364/513 |
| 4,943,924 | 7/1990 | Kanegae et al. | 364/431.04 |
| 4,964,043 | 10/1990 | Galvin | 364/401 |
| 4,965,742 | 10/1990 | Skeirik | 364/138 |
| 4,965,743 | 10/1990 | Malin et al. | 364/513 |
| 4,984,773 | 1/1991 | Balban et al. | 364/513 |

FOREIGN PATENT DOCUMENTS 62-214438 9/1987 Japan .
63-101933 6/1988 Japan .

*Primary Examiner*—Michael R. Fleming
*Assistant Examiner*—George Davis
*Attorney, Agent, or Firm*—Fay, Sharpe, Beall, Fagan, Minnich & McKee

[57] ABSTRACT

Disclosed herein are a method and a system of specification processing whereby are input the design specifications of a system under development, the expert knowledge of the system addressing these specifications, and the expert knowledge of a particular field to which the system belongs. The design specifications are transformed into information in list image having feasibility and containing state transitions and transition conditions. The information in list image is then edited as model specifications formed by the basic commands for outputting graphical image information. Document information is output in accordance with the model specifications (instruction words) and the expert knowledge. When output, the document information has high levels of both formality and understandability. The transformed information in list image can be verified in text image or graphical image in accordance with the transition conditions.

3 Claims, 32 Drawing Sheets

FIG. 4 a | FW | Xnum | Ynum |

FIG. 4 b | FWM | Xnum | Ynum |

FIG. 4 c | FWL | Kind | Ltype | Xnum | Ynum |

FIG. 4 d | FWC | Kind | Ltype | Xnum | Ynum | Pleng |

FIG. 4 e | FWP | Kind | Ltype | Xnum | Ynum |

FIG. 4 f | FWT | Xnum | Ynum | Chnum | Str |

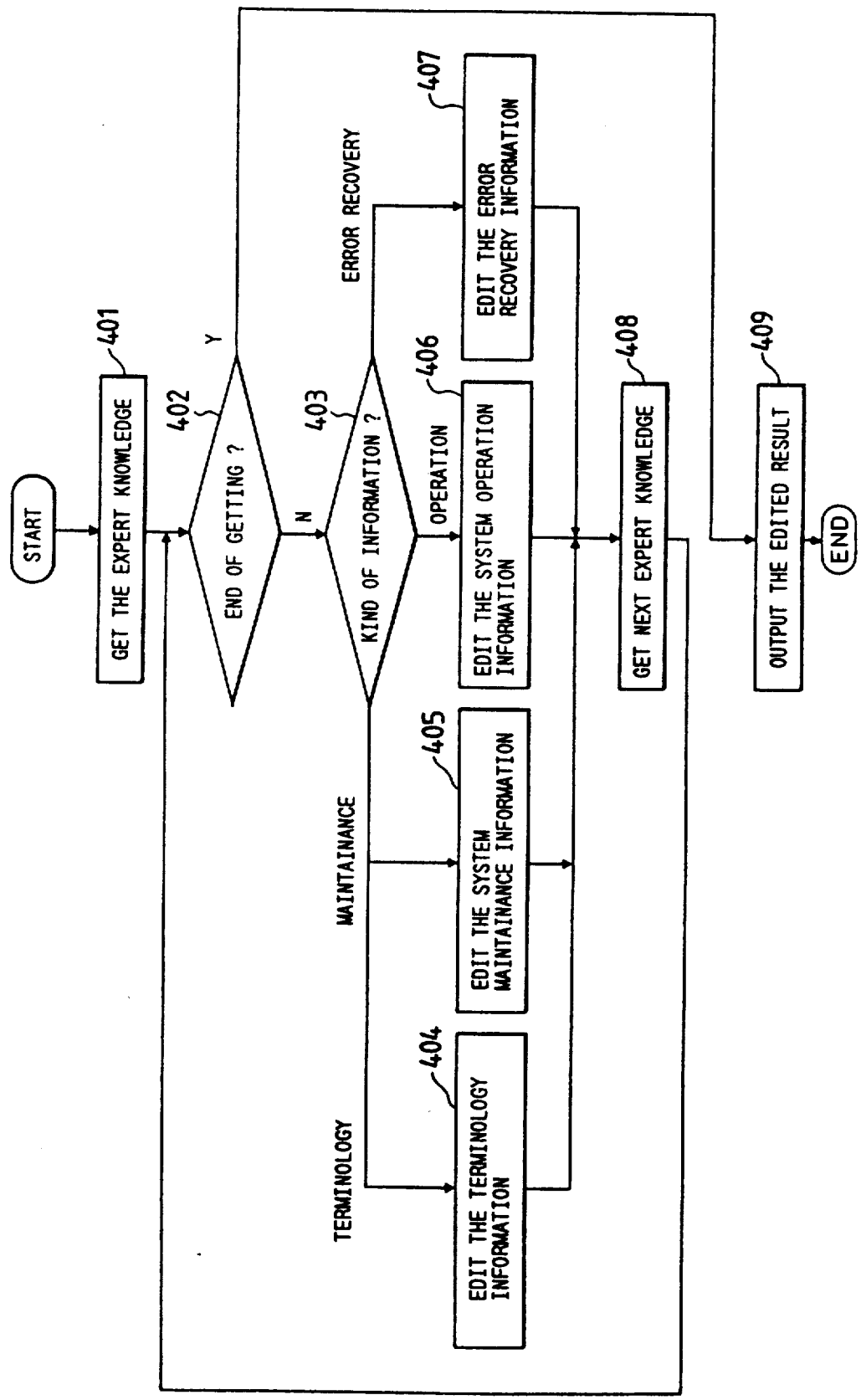

FIG. 15(a)

| | |
|---|---|
| (1) | S → G<br>G=(S/24 OMIT BELOW THE DECIMAL POINT)+1 |
| (2) | S → (X, Y)<br>Y=1+(S/4 OMIT BELOW THE DECIMAL POINT)<br>X=(S-(Y-1)*4 WHEN Y IS AN ODD NUMBER) OR (4*Y-S WHEN Y IS EVEN NUMBER) |
| (3) | (X, Y) → (m, n)<br>m=5+18*(X-1)   n=3+12*(Y-1)-23*(G-1) |
| (4) | TRANSITION OUTPUT<br>{ LCYCLE \| m-2 \| n \| 2 \| RCYCLE \| m+2 \| n \| 2 }<br>{ LINE \| m-2 \| n+2 \| m+2 \| n+2 \| LINE \| m-2 \| n-2 \| m+2 \| n-2 } |
| (5) | OUTPUT CURRENT STATE<br>{ PAINT \| m-2 \| n \| m+2 \| n } |
| (6) | DELETE MASK OF CURRENT STATE<br>{ DELET \| m-2 \| n \| m+2 \| n } |
| (7) | ARROW<br>① > RIGHT DIRECTED ARROW RSIGN(m, n)<br>{ LINE \| m \| n \| m-1 \| n+1 \| LINE \| m \| n \| m-1 \| n-1 }<br><br>② ∧ UPWARD DIRECTED ARROW USIGN(m, n)<br>{ LINE \| m \| n \| m+1 \| n+1 \| LINE \| m \| n \| m-1 \| n+1 }<br><br>③ < LEFT WARD DIRECTED ARROW LSIGN(m, n)<br>{ LINE \| m \| n \| m+1 \| n+1 \| LINE \| m \| n \| m+1 \| n-1 } |

FIG. 15(b)

(7) ④ ∨ DOWNWARD DIRECTED ARROW DDIGN (m, n)

| LINE | m | n | m+1 | n-1 | LINE | m | n | m-1 | n-1 |

(8) TRANSITION OUTPUT, POSITION (X', Y') OF THE NEXT STATE OF TRANSITION, THE STATE POSITION (X, Y)
(a) WHEN G'=G
i) CASE OF THE LINE WITH ONE CORNER

① WHEN (X'-X=0) AND (Y'-Y=1)

| LINE | m' | n'-2m | n+2 | DSIGN | m' | n'-2 |

② WHEN (X'-X=0) AND (Y'-Y=-1)

| LINE | m' | n'+2 | m | n-2 | USIGN | m' | n'+2 |

③ WHEN (Y'-Y=0) AND (X'-X=1)

| LINE | m'-4 | n' | m | n-2 | RSIGN | m'-4 | n' |

④ WHEN (Y'-Y=0) AND (X'-X=-1)

| LINE | m'+4 | n' | m+4 | n | LSIGN | m'+4 | n' | ii) CASE OF THE LINE WITH TWO CORNERS

① WHEN (Y'-Y=0) AND {(X'-X=0) AND EXCEPT (X'-X=+-1)}

| LINE | m' | n'+2 | m' | n'+4 | LINE | m | n'+2 | m | n+4 |

| LINE | m' | n'+4 | m | n+4 | USIGN | m' | n'+2 |

② WHEN (Y'-Y=1) AND (EXCEPT (X'-X=0))

| LINE | m | n+2 | m | n+5 | LINE | m | n+5 | m' | n+5 |

| LINE | m' | n+5 | m' | n'-2 | DSIGN | m' | n'-2 |

| LINE | m | n+2 | m | n+5 | LINE | m | n+5 | m' | n+5 |

| LINE | m' | n+5 | m' | 23+h |

FORMAT ITEM OF G' IS

| LINE | m' | 0 | m' | n'-2 | DSIGN | m' | n'-2 |

③ WHEN (Y'-Y=-1) AND (EXCEPT (X'-X=0))
FORMAT ITEM OF G IS

| LINE | m | n-2 | m | n-5 | LINE | m | n-5 | m' | n-5 |

| LINE | m' | n-5 | m' | 0 |

FORMAT ITEM OF G' IS

| LINE | m' | 23+h | m' | n'+2 | USIGN | m' | n'+2 | iii) CASE OF THE LINE WITH FOUR CORNERS

① WHEN (X'-X=0) AND (Y'-Y=POSITIVE)
FORMAT ITEM OF G IS

| LINE | m | n+2 | m | n+5 | LINE | m | n+5 | m+6 | n+5 |

| LINE | m+6 | 23+h | m+6 | n+5 |

FORMAT ITEM OF G' IS

| LINE | m' | n'-2 | m' | n'-5 | LINE | m' | n'-5 | m'+6 | n'-5 |

| LINE | m'+6 | N-5 | m+6 | 0 | DSIGN | m' | n'-2 |

FIG. 15(c2)

(8) ② WHEN (X'-X=0) AND (Y'-Y=NEGATIVE)
FORMAT ITEM OF G IS

| LINE | m | n-2 | m | n-5 | LINE | m | n-5 | m+6 | n-5 |

| LINE | m'+6 | 0 | m+6 | n-5 | DSIGN | m' | n'+2 |

FORMAT ITEM OF G' IS

| LINE | m' | n'+2 | m' | n'+5 | LINE | m' | n'+5 | m'+6 | n'+5 |

| LINE | m'+6 | n'+5 | m+6 | 23+h | DSIGN | m' | n'+2 |

③ WHEN (EXCEPT X'-X=1) AND (X'+X=POSITIVE) AND (EXCEPT Y'-Y=1) AND
(Y'-Y=POSITIVE)
FORMAT ITEM OF G IS

| LINE | m | n+2 | m | n+5 | LINE | m | n+5 | m+6 | n+5 |

FIG. 15(d)

(8)
{ LINE | m+6 | n+5 | 23+h }

FORMAT ITEM OF G' IS

{ LINE | m+6 | 0 | m+6 | n'-5 | LINE | m+6 | n'-5 | m' | n'-5 }

{ LINE | m' | n'-5 | m' | n'-2 | DSIGN | m' | n'-2 }

④ WHEN (EXCEPT X'-X=-1) AND (X'-X=NEGATIVE) AND (EXCEPT Y'-Y=-1) AND (Y'-Y=NEGATIVE)
FORMAT ITEM OF G IS

{ LINE | m | n-2 | m | n-5 | LINE | m | n-5 | m-6 | m-5 }

{ LINE | m-6 | n-5 | m-6 | 0 }

FORMAT ITEM OF G' IS

{ LINE | m-6 | 23+h | m-6 | n'+5 | LINE | m-6 | n'+5 | m' | n'+5 }

{ LINE | m' | n'+5 | m' | n'+2 | USIGN | m' | n'+2 }

⑤ WHEN (EXCEPT X'-X=1) AND (X'-X=POSITIVE) AND (EXCEPT Y'-Y=-1) AND (Y'-Y=NEGATIVE)
FORMAT ITEM OF G IS

{ LINE | m | n-2 | m | n+5 | LINE | m | n-5 | m+6 | n-5 }

{ LINE | m+6 | n-5 | m+6 | 0 }

FORMAT ITEM OF G' IS

{ LINE | m+6 | 23+h | m+6 | n'+5 | LINE | m+6 | n'+5 | m' | n'+5 }

{ LINE | m' | n'+5 | m' | n'+2 | USIGN | m' | n'+2 }

⑥ WHEN (EXCEPT X'-X=-1) AND (X'-X=NEGATIVE) AND (EXCEPT Y'-Y=1) AND (Y'-Y=POSITIVE)
FORMAT ITEM OF G IS

{ LINE | m | n+2 | m | n-5 | LINE | m | n+5 | m-6 | n+5 }

{ LINE | m-6 | n+5 | m-6 | 23+h }

FORMAT ITEM OF G' IS

{ LINE | m-6 | 0 | m-6 | n'-5 | LINE | m-6 | n'-5 | m' | n'-5 }

{ LINE | m' | n'-5 | m' | n'-2 | USIGN | m' | n'-2 }

| LINE | m' | n'+5 | m' | n'+2 | USIGN | m' | n'+2 |

⑦ WHEN (EXCEPT X'-X=1) AND (X'-X=POSITIVE) AND (EXCEPT Y'-Y=-1) AND (Y'-Y=NEGATIVE)

| LINE | m | n-2 | m | n+5 | LINE | m | n-5 | m+6 | n-5 |

| LINE | m+6 | n-5 | m+6 | n'+5 | LINE | m+6 | n'+5 | m' | n'+5 |

| LINE | m' | n'+5 | m' | n'+2 | USIGN | m' | n'+2 |

⑧ WHEN (EXCEPT X'-X=-1) AND (X'-X=NEGATIVE) AND (EXCEPT Y'-Y=1) AND (Y'-Y=POSITIVE)

| LINE | m | n+2 | m | n-5 | LINE | m | n+5 | m-6 | n+5 |

| LINE | m-6 | n+5 | m-6 | n'-5 | LINE | m-6 | n'-5 | m' | n'-5 |

| LINE | m' | n'-5 | m' | n'-2 | USIGN | m' | n'-2 |

(b) TRANSITION OUTPUT, POSITION (X', Y') OF THE NEXT STATE OF TRANSITION, THE STATE POSITION (X, Y), WHEN G'<> G
h=0 WHEN THE STATE TRANSITION GRAPHIC INFORMATION IS OUTPUTTED
h=-5 WHEN THE STATE LOG GRAPHIC INFORMATION IS OUTPUTTED i) CASE OF THE LINE WITH ONE CORNER

① WHEN (X'-X=0) AND (Y'-Y=1)
FORMAT ITEM OF G IS

| LINE | m | 23+h | m | n+2 |

FORMAT ITEM OF G' IS

| LINE | m' | n'-2 | m' | 0 | DSIGN | m' | n'-2 |

② WHEN (X'-X=0) AND (Y'-Y=1)
FORMAT ITEM OF G IS

| LINE | m | 0 | m | n-2 |

FORMAT ITEM OF G' IS

| LINE | m' | n'+2 | m' | 23+h | USIGN | m' | n'+2 | ii) CASE OF THE LINE WITH TWO CORNERS

① WHEN (Y'-Y=1) AND {EXCEPT (X'-X=0)}
FORMAT ITEM OF G IS

FIG. 15(f)

(8)
③ WHEN (Y'-Y=-1) AND (EXCEPT (X'-X=0))

| LINE | m | n-2 | m | n-5 | LINE | m | n-5 | m' | n-5 |

| LINE | m' | n-5 | m' | n'+2 | USIGN | m' | n'+2 | iii) CACE OF THE LINE WITH FOUR CORNERS

① WHEN (X'-X=0) AND (Y'-Y=POSITIVE)

| LINE | m | n+2 | m | n+5 | LINE | m | n+5 | m+6 | n+5 |

| LINE | m' | n'-2 | m' | n'-5 | LINE | m' | n'-5 | m'+6 | n'-5 |

| LINE | m'+6 | n'-5 | m+6 | n+5 | DSIGN | m' | n'-2 |

② WHEN (X'-X=0) AND (Y'-Y=NEGATIVE)

| LINE | m | n-2 | m | n-5 | LINE | m | n-5 | m+6 | n-5 |

| LINE | m' | n'+2 | m' | n'+5 | LINE | m' | n'+5 | m'+6 | n'+5 |

| LINE | m'+6 | n'+5 | m+6 | n-5 | DSIGN | m' | n'+2 |

③ WHEN (EXCEPT X'-X=1) AND (X'-X=POSITIVE) AND (EXCEPT Y'-Y=1) AND (Y'-Y=POSITIVE)

| LINE | m | n+2 | m | n+5 | LINE | m | n+5 | m+6 | n+5 |

| LINE | m+6 | n+5 | m+6 | n'-5 | LINE | m+6 | n'-5 | m' | n'-5 |

| LINE | m' | n'-5 | m' | n'-2 | DSIGN | m' | n'-2 |

④ WHEN (EXCEPT X'-X=-1) AND (X'-X=NEGATIVE) AND (EXCEPT Y'-Y=-1) AND Y'-Y=NEGATIVE)

| LINE | m | n-2 | m | n-5 | LINE | m | n-5 | m-6 | n-5 |

| LINE | m-6 | n-5 | m-6 | n'+5 | LINE | m-6 | n'+5 | m' | n'+5 |

STATE TABLE

| LINKAGE NUMBER TO TRANSITION TABLE | STATE NAME | STATE KIND |
|---|---|---|
| | | |
| | | |
| | | |
| | | |
| | | |

FIG. 17a

TRANSITION TABLE

| STATE NAME NUMBER | TRANSITION CONDITION | NEXT STATE NAME NUMBER OF TRANSITION | TRANSITION OUTPUT | SAME STATE TRANSITION NAME NUMBER | LINKAGE NUMBER TO PREVIOUS FIELD | LINKAGE NUMBER TO NEXT FIELD |
|---|---|---|---|---|---|---|
| | | | | | | |
| | | | | | | |
| | | | | | | |
| | | | | | | |
| | | | | | | |
| | | | | | | |
| | | | | | | |

FIG. 17b

TRANSITION LOG INFORMATION TABLE

| STATE NAME | INPUT TRANSITION CONDITION INFORMATION | TRANSITION CONDITION | TRANSITION OUTPUT | ERROR NUMBER |
|---|---|---|---|---|
| | | | | |
| | | | | |
| | | | | |
| | | | | |
| | | | | |
| | | | | |

FIG. 17c

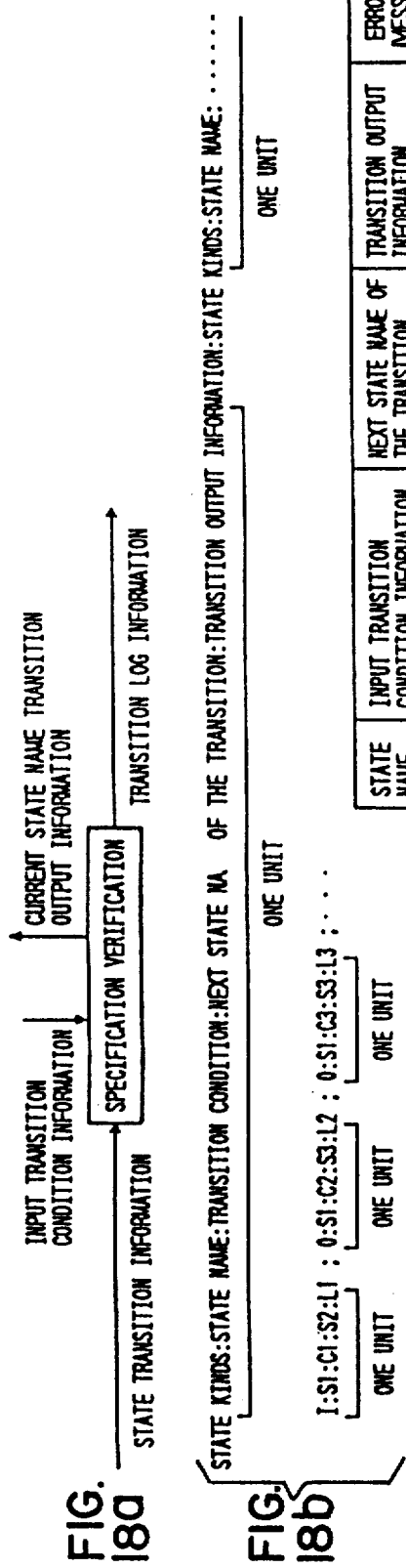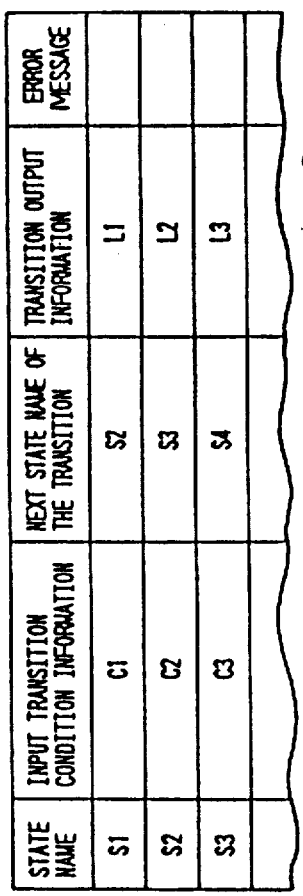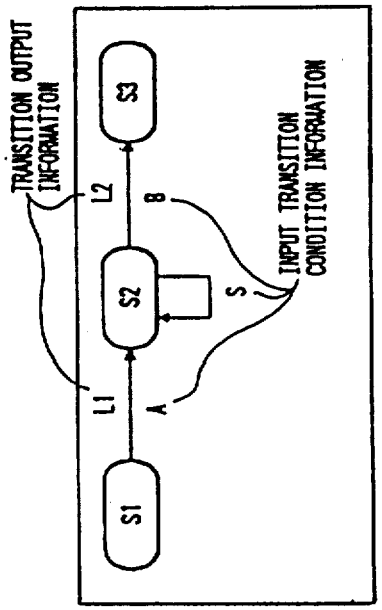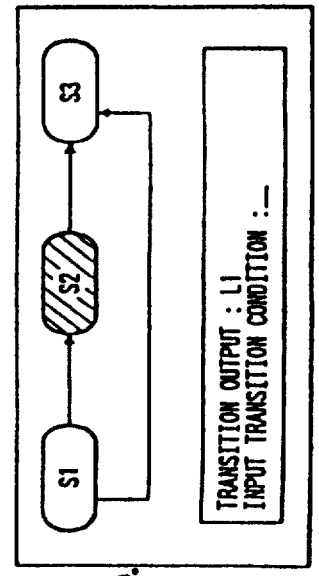

FIG. 19

```
CURRENT STATE NAME       :S1
INTUT TRANSITION CONDITION :C1
CURRENT STATE NAME       :S2
TRANSITION OUTPUT        :_
```

FIG. 20

| STATE NAME | INPUT TRANSITION CONDITION INFORMATION | NEXT STATE NAME OF THE TRANSITION | TRANSITION OUTPUT INFORMATION | ERROR MESSAGE |
|---|---|---|---|---|
| S1 | C1 | S2 | L1 | |
| S2 | C2 | S3 | L2 | |
| S3 | C3 | S4 | L3 | |
| S5 | C4 | S6 | L4 | |
| S6 | C2 | | | UNMATCHED CONDITION |
| S6 | C5 | S7 | L5 | |
| S7 | C6 | S8 | L6 | |
| S8 | C7 | S9 | L7 | |
| S9 | C8 | S10 | L8 | |
| S10 | C9 | S11 | L9 | |

FIG. 21

| S11 | C10 | S12 | L10 | |
|---|---|---|---|---|
| S12 | C11 | S13 | L11 | |

FIG. 27a
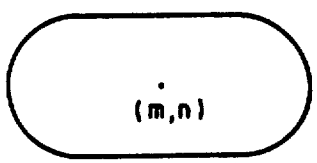
FIG. 27b
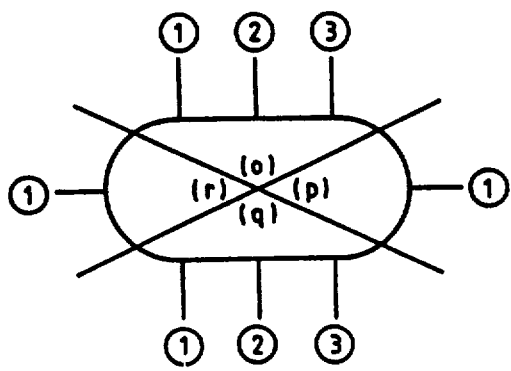
FIG. 27c  0 CORNER
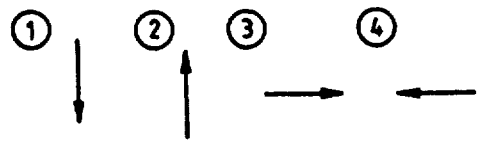
FIG. 27d  2 CORNERS
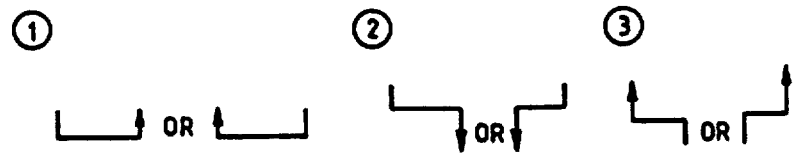
FIG. 27e  4 CORNERS
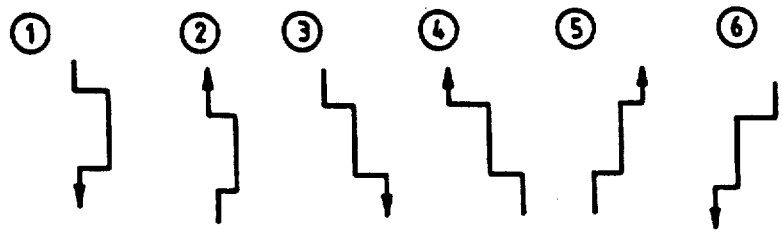

METHOD AND SYSTEM OF SPECIFICATION PROCESSING

BACKGROUND OF THE INVENTION

1. Field of the Invention:

The present invention relates to a method and a system of specification processing and, more particularly, to a method and system adapted to input design specifications (current specifications of a system under development), an expert knowledge of the system based on the design specifications, and expert knowledge of each field that the system belongs to, and to utilize these bodies of knowledge and information for editing and outputting documents of the object system to be developed and for verifying its design specifications.

2. Description of the Prior Art:

To improve the reliability of a system, it is indispensable to define clear-cut specifications that permit appropriate design of the system. To define the specifications requires that the system be described in the following manner:

(a) The description should be free of ambiguity.

(b) It should be easy to verify the description on a static basis.

(c) It should be easier to write and read the system specifications than to prepare the corresponding source code.

The following is what was customarily practiced in the prior art design stage:

(a) Highly practical specification methods were not proposed. Thus systems had to be designed in specifications based on designers' experience and intuitive expertise.

(b) Because of the lack of highly practical specification methods, documents had to be prepared in natural language based on designers' experience and intuitive expertise.

(c) Each system was verified not in the specifying stage but in a separate testing stage.

(d) The design specifications were verified in text format.

The prior art practices described above posed the following problems:

(1) The specifications prepared according to practice (a) above contained appreciable degrees of ambiguity.

(2) The documents prepared according to practice (b) above relied significantly on designers' experience and intuitive expertise. A row of expert knowledge constituting these documents made it difficult to understand what was written in them.

(3) The documents prepared according to practice (b) above were not necessarily executable as they were. It was impossible to verify in document form whether these specifications were correct.

(4) Verifying the specifications placed heavy burdens on the testing stage in which the verifying was done. In addition, it was difficult to detect in the testing stage all errors that might have been incorporated since the design stage. The specifications of each process should be verified within that process. This leads to improved system reliability. Having to detect design errors only in the testing stage detracts from the reliability of the system under development.

(5) Practice (d) above failed to provide high levels of understandability for the verification of the design specifications.

SUMMARY OF THE INVENTION

It is therefore the primary object of the present invention to provide a method and a system capable of eliminating the above-mentioned drawbacks in the prior art, acquiring document information free of ambiguity and having high levels of understandability, reducing the burdens on the testing stage, and improving the reliability of the system under development.

According to one aspect of the invention, there is provided a specification processing method or system which outputs document information through the use of the design specifications of a system being developed and the expert knowledge of that system. Under this method or system, the design specifications are converted to information in list image containing state transition information and transition conditions. The transformed information is input as operand information about basic instructions for diagramming. The document information is edited and output based on the input basic instructions as well as on the expert knowledge mentioned above. It is also possible, based on the above-mentioned transition conditions, to verify the list-image information in text or graphical image. The structure elements of the design specifications are output as text image information. This text image information is edited as model specifications having basic commands for outputting graphical image information. Finally, the document information is edited and output based on the edited model specifications as well as on the above-mentioned expert knowledge.

According to another aspect of the present invention, there are provided a method and a system of specification processing capable of inputting design specifications (i.e., current specifications of a system under development), the expert knowledge of the system being developed based on the design specifications, and the expert knowledge of a particular field to which the system belongs, and of building a complete set of the specifications of the system according to the above bodies of knowledge and information, thereby outputting document information having high levels of formality and understandability.

According to further aspect of the present invention, there are provided a method and a system of specification processing capable of establishing specifications having high levels of feasibility, thereby verifying the specification for their correctness.

According to yet another aspect of the present invention, there are provided a method and a system of specification processing capable of transforming design specifications into model specifications (instruction words) in effect upon document information output and of outputting the document information by use of the model specifications, thereby improving the processing efficiency.

The foregoing and other objects, advantages, manner of operation and novel features of the present invention will be understood from the following detailed description when read in connection with the accompanying drawings.

BRIEF DESCRIPTION OF THE DRAWINGS

FIGS. 4(a), 4(b), 4(c), 4(d), 4(e), and 4(f) are views depicting the instruction word formats stored in a model specification storage file of the embodiment;

FIGS. 5(a) and 5(b) are flowcharts showing how a document information output process of the embodiment works;

FIGS. 15(a), 15(b), 15(c₁), 15(c₂), 15(d), 15(e) and 15(f) are views illustrating how a diagramming process of the embodiment works;

FIGS. 17(a), 17(b) and 17(c) are views depicting the formats of a state transition information table and a transition log information table used by the embodiment;

FIGS. 18(a), 18(b), 18(c), 18(d), 18(e) and 18(f) are views illustrating the operating principles of the specification verifying process;

FIG. 19 is a view showing a text verifying format for a text verifying process of the embodiment;

FIGS. 20 and 21 are views describing the formats in which to output transition log information following text verification;

FIGS. 27(a), 27(b), 27(c), 27(d) and 27(e) are views depicting the formats in which to output states and transitions.

DETAILED DESCRIPTION OF THE PREFERRED EMBODIMENTS

There will now be described the operating principles underlying the present invention, followed by a detailed description of a preferred embodiment thereof.

Figure 6:
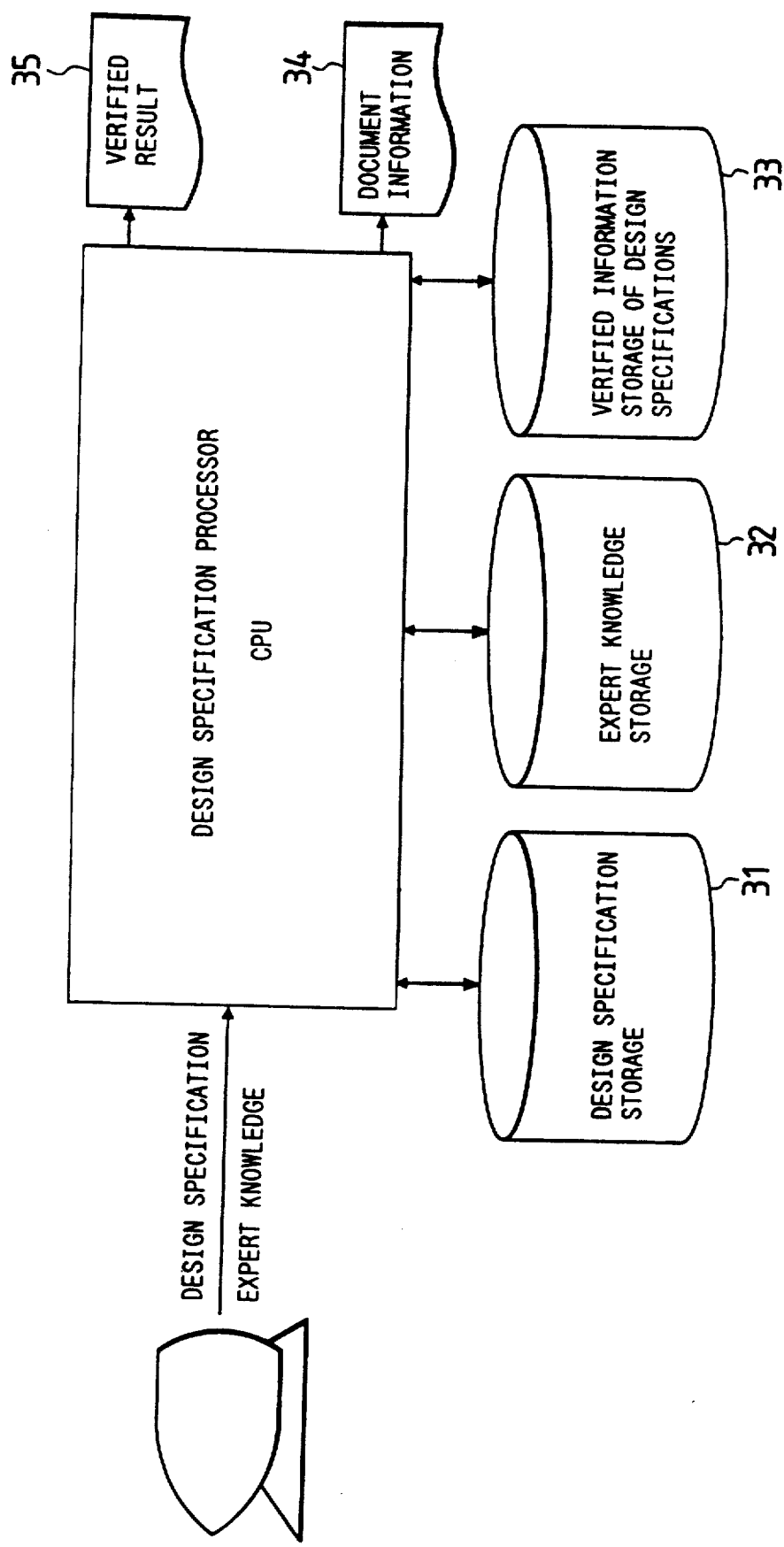
FIG. 6 is a system configuration diagram illustrating how a design specification processor of the embodiment is configured.

FIG. 6 is a system configuration diagram of a system to which the present invention may be applied. As shown in the figure, the design specification processing method of this embodiment is a method which permits successive input of design specifications 31 (i.e., current information about a system to be developed), an expert knowledge 32 of the system to be developed based on the design specifications, and an expert knowledge 33 of a particular field to which the system belongs. Following the input, the method then provides editing and output of document information 34 having appreciable levels of both formality and understandability in accordance with the above-mentioned bodies of knowledge and information. The design specification processing method is also a method by which to verify whether the specifications termed as executable are indeed executable.

Below are typical structures of the design specifications 31, expert knowledge 32 and expert knowledge 33.

<design specifications> ::= <row of design specifications>

<row of design specifications> ::= { <design specifications> }

<design specifications> ::= <process specifications> <state transition specifications>

<process specifications> ::= <process entity specifications> <process relation specifications> <message specifications>

<process entity specifications> ::= { <process name> <communication attribute> }

<communication attribute> ::= <communication passage specifications> <synchronization attribute>

<process relation specifications> ::= <sender communication process specifications> <receiver communication process specifications>

<sender communication process specifications>, <receiver communication process specifications> ::= { <process name> <communication attribute> }

<process dependency specifications> ::= <parent process name> <child process name>

<state transition specifications> ::= <state specifications> <transition specifications>

<state specifications> ::= <process name> "," <state name>

<transition specifications> ::= <data structure specifications>

<design specifications and expert knowledge> ::= <row of design specifications and expert knowledge>

<row of design specifications and expert knowledge> ::= } <design specifications and expert knowledge> }

<design specifications and expert knowledge> ::= <terminology dictionary specifications>

<field-wise design specifications and expert knowledge> ::= <row of field-wise design specifications and expert knowledge>

<row of field-wise design specifications and expert knowledge> ::= { <field-wise design specifications and expert knowledge> }

```
<field-wise design specifications and expert knowl-
  edge> ::= <terminology dictionary specifica-
  tions>
  | <system maintenance specifications>
  | <system operation specifications>
  | <error recovery specifications>
```

The syntax for the above bodies of information and knowledge is defined in the Backus-Naur form. Of the symbols used, "::=" indicates that the terms on the left are defined by those on the right; "{ }" means a series of entries in < > each; and quotation marks (" ") serve as a terminal symbol each. The design specifications are represented by the information of <process specifications> and <state transition specifications>, as described above.

Each function of the object system to be described is divided into sub-functions, each sub-function being defined as a unit of parallel operation comprised of processes. This is what is defined by the information of <process specifications>. Each function when divided may also be defined as a group of sub-functions to be processed in series and constituting a finite state automation. This is what is defined by the information of <state transition specifications>. The expert knowledge of the system based on the design specifications and the expert knowledge for a specific field of the system are represented by the information of <terminology dictionary specifications>, <system maintenance specifications>, <system operation specifications> and <error recovery specifications>.

Figure 1:
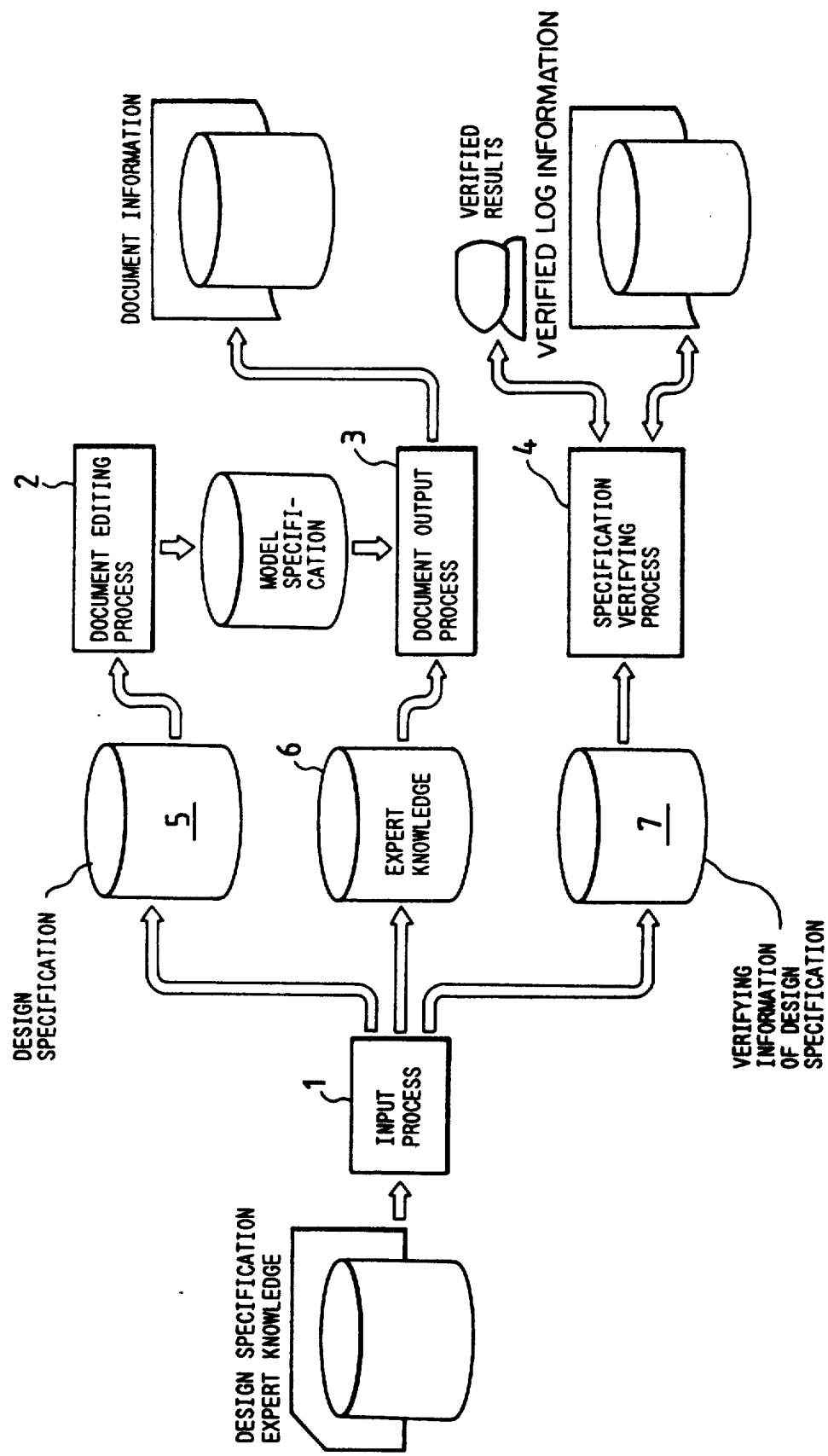
FIG. 1 is a functional diagram of a design specification processing method embodying the present invention.

FIG. 1 shows in functional diagram a design specification processing method embodying the present invention. As shown, the design specification processing method comprises an input process 1, a document editing process 2, a document output process 3, and a specification verifying process 4. The input process 1 receives as input information the design specifications (i.e., current specifications of the system to be developed), the expert knowledge of the system based on these design specifications, and the expert knowledge for a particular field of the system. These bodies of knowledge and information are stored in a design specification file and an expert knowledge file. The design specifications are transformed into information in list image, called verifying information, and stored in a separate file.

The document editing process 2 retrieves the design specifications from their file in storage and transforms the information into model specifications that are stored in a file preparatory to the output as document information in formal description (i.e., diagrammatic description).

The document output process 3 outputs, for storage into a file, the process specifications and state transition specifications as document information in formal description in accordance with the transformed model specifications and expert knowledge. In this process, an expert terminology dictionary covering the design specifications is prepared and output. Also performed in this process is the output, as document information, of the procedures for the maintenance and operation of the system under development as well as the procedures for error recovery.

Figure 7:
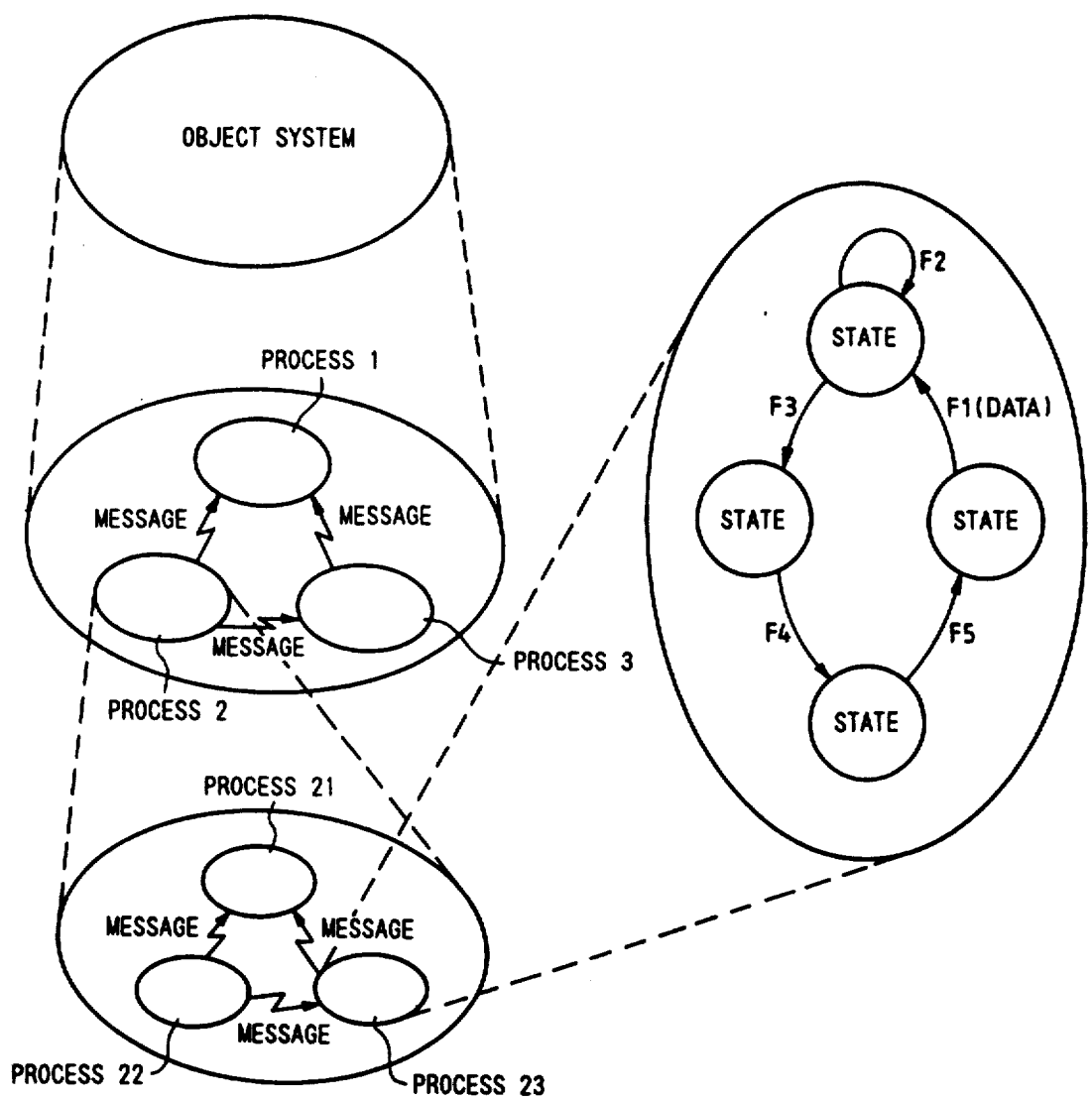
FIG. 7 is a view showing how design specifications of an object system are prepared in what is known as formal description.
Figure 8:
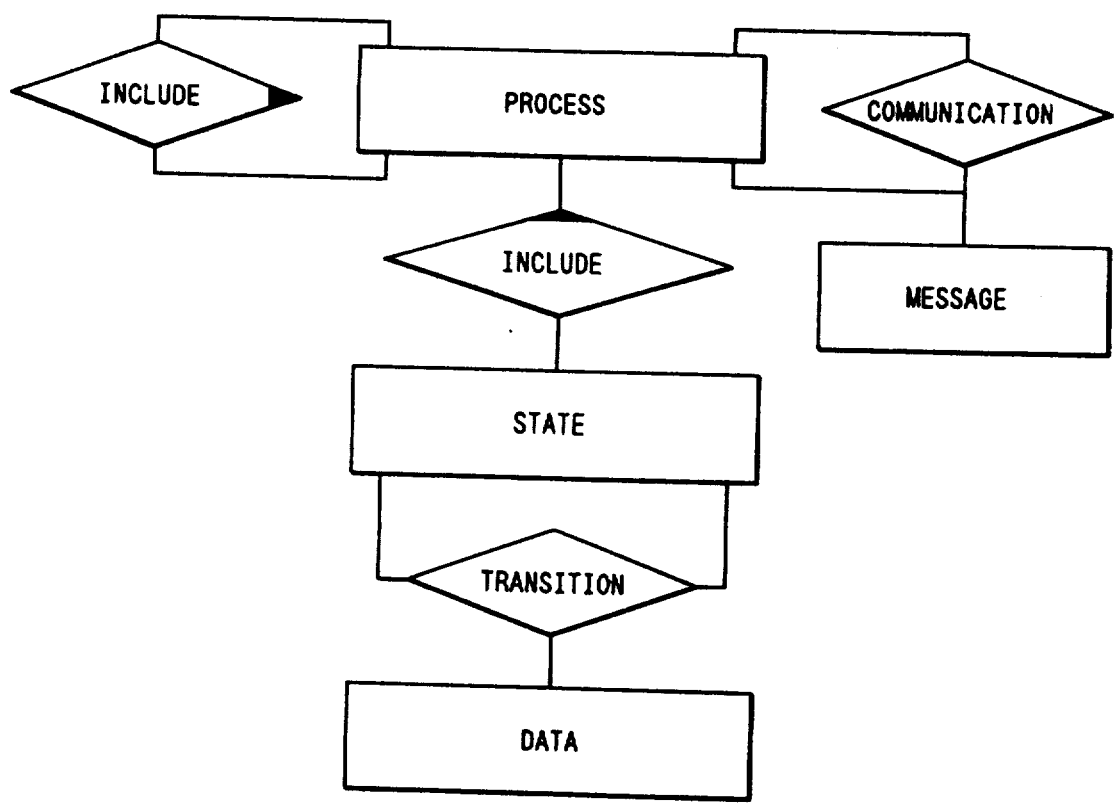
FIG. 8 is a schema of design specifications for the embodiment.
Figure 9:
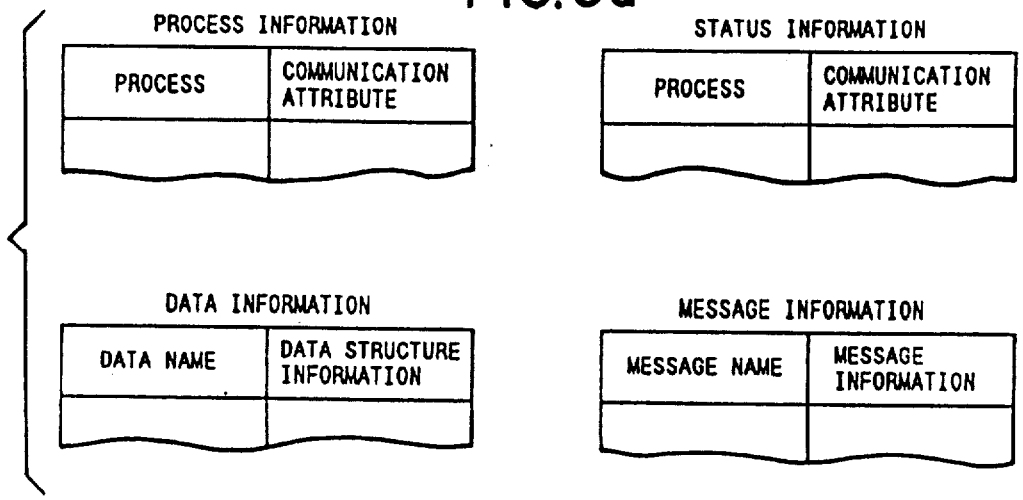
FIGS. 9(a), 9(b), 9(c), 9(d) and 9(e) are views showing the internal format for design specifications to be dealt with by the embodiment.

FIG. 7 illustrates the design specifications of the object system. In this figure, the various bodies of knowledge and information stored in the above-described process are shown to be represented by information in list image so as to make references to the knowledge or information with high efficiency. FIG. 8 is a schema of the design specifications. FIG. 9 is a set of views showing how the list-image information is structured. Below is a description of the arrangements depicted in the above figures.

Subfigure (a) of FIG. 9 indicates process, status, data and message information as entity information (represented by rectangles  in FIG. 8) that occurs in the design specifications. Subfigures (b) and (d) show the relations between processes and between states (as represented by lozenges  in FIG. 8). Subfigures (c) and (e) depict the dependencies between process and sub-process and between process and state (as represented by lozenges with a painted corner ).

(1) Process information

Process information is a body of information that defines the functions of an object system as a collection of units of parallel operations. This is entity information which occurs in the design specifications. The information comprises process names and communication attributes, with a process name used as a key.

(2) Status information

Status information is a body of information that defines parallelly operating processes as a group of sub-functions to be processed in series constituting a finite state automation. This is entity information which occurs in the design specifications. The information comprises process and state names, with a state name used as a key.

(3) Message information

Message information is a body of information exchanged between processes. This is entity information which occurs in the design specifications. The information comprises message names and message structure information, with a message name used as a key.

(4) Data information

Data information is a body of information that is input and output by the finite state automation between states. This is entity information which occurs in the design specifications. The information comprises data names and data structure information, with a data name used as a key.

(5) Process relation information

Process relation information is a body of information that defines the relations between parallelly operating processes. The information comprises sender communication process names, sender communication attributes, receiver communication process names, receiver communication attributes and message names, with a sender communication specification used as a key.

(6) State relation information

State relation information is a body of information that defines the relations between states in transition. The information comprises previous state process names, previous state names, next state process names, next state names and data names, with a previous state specification used as a key.

(7) Process dependency information

Process dependency information is a body of information that defines the dependencies between process and sub-process. The information comprises parent and child process names, with a parent process name used used as a key.

(8) Process and state dependency information

Process and state dependency information is a body of information that defines the states in transition inside processes. The information comprises process names and related states (process names, state names), with a process name used as a key.

When document information is to be edited and output, the steps below are carried out in accordance with the above-described information:

Step (1): input of the above-described information

The information described above is retrieved in this step while step (2) is being repeated. When the input has been exhausted, the edited results are output as model specifications, as shown in FIG. 7.

Step (2): editing and output of document information (a) Editing of process specifications A process name is first retrieved from the process specifications. Then the receiver communication process specification and message name related to this process name are retrieved with a sender process specification used as a key. Next, the message structure information related to the retrieved message is retrieved. If the previously retrieved process has a sub-process, this sub-process is also retrieved using the process name as a key. The processes thus retrieved from the process information are combined according to the other information mentioned above, and edited as process specifications.

(b) Editing of state transition specifications

A state name is retrieved from state information. Then the next state specification, data name, and previous state specification related to that state name are retrieved. In turn, the data structure information related to the retrieved data name is retrieved. The states thus retrieved from the state information are combined according to the other information mentioned above, and edited as state transition information.

Also retrieved in addition to the foregoing information is such document information as <terminology dictionary specifications>, <system maintenance specifications>, <system operation specifications> and <error recovery specifications>. These bodies of information are taken from the expert knowledge before they are edited and output.

The operations involved in each process will now be described in detail by referring to the flowcharts of FIGS. 3 through 5.

Figure 3A:
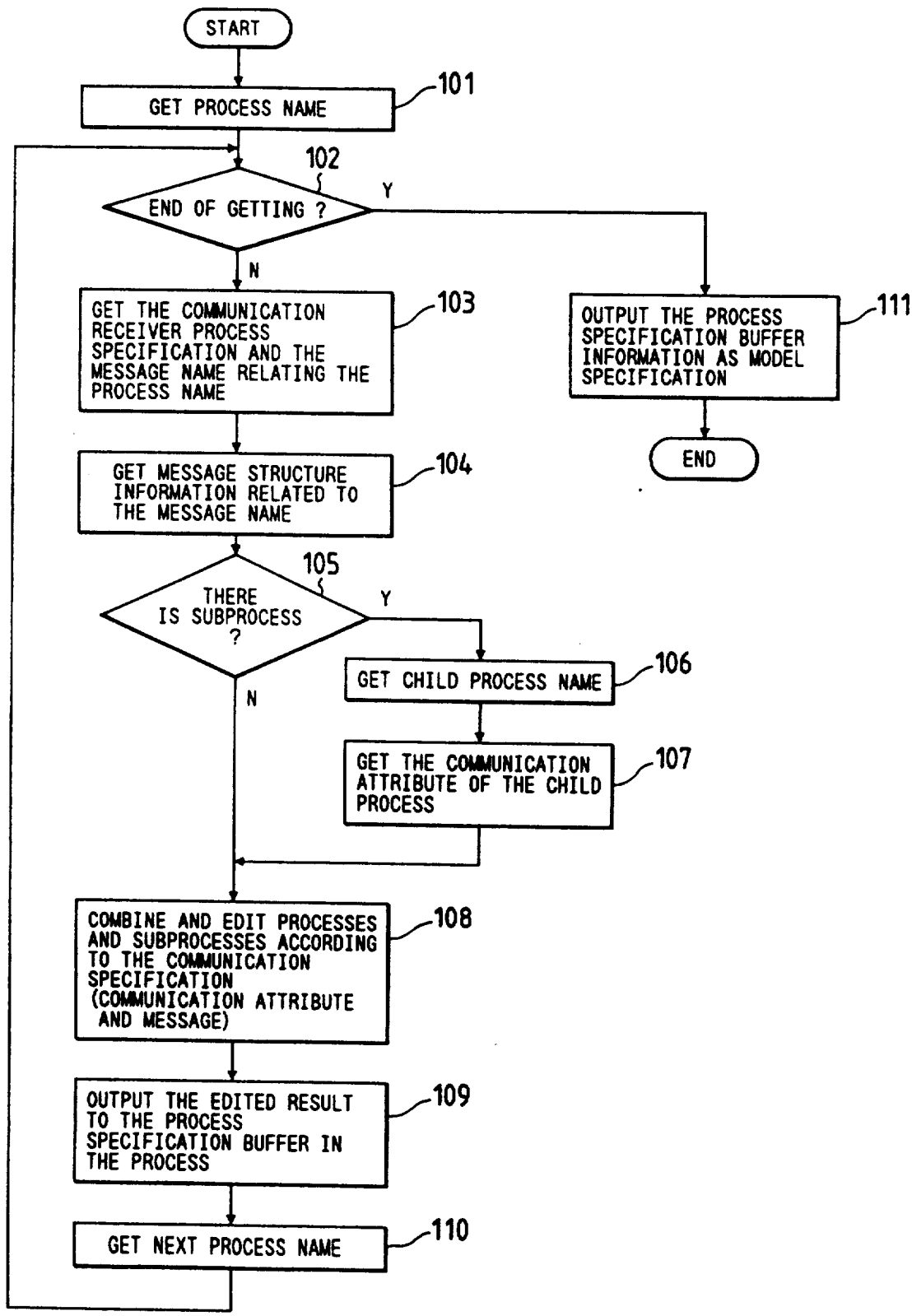
FIGS. 3(a) and 3(b) are flowcharts showing how a document editing process of the embodiment works.
Figure 3B:
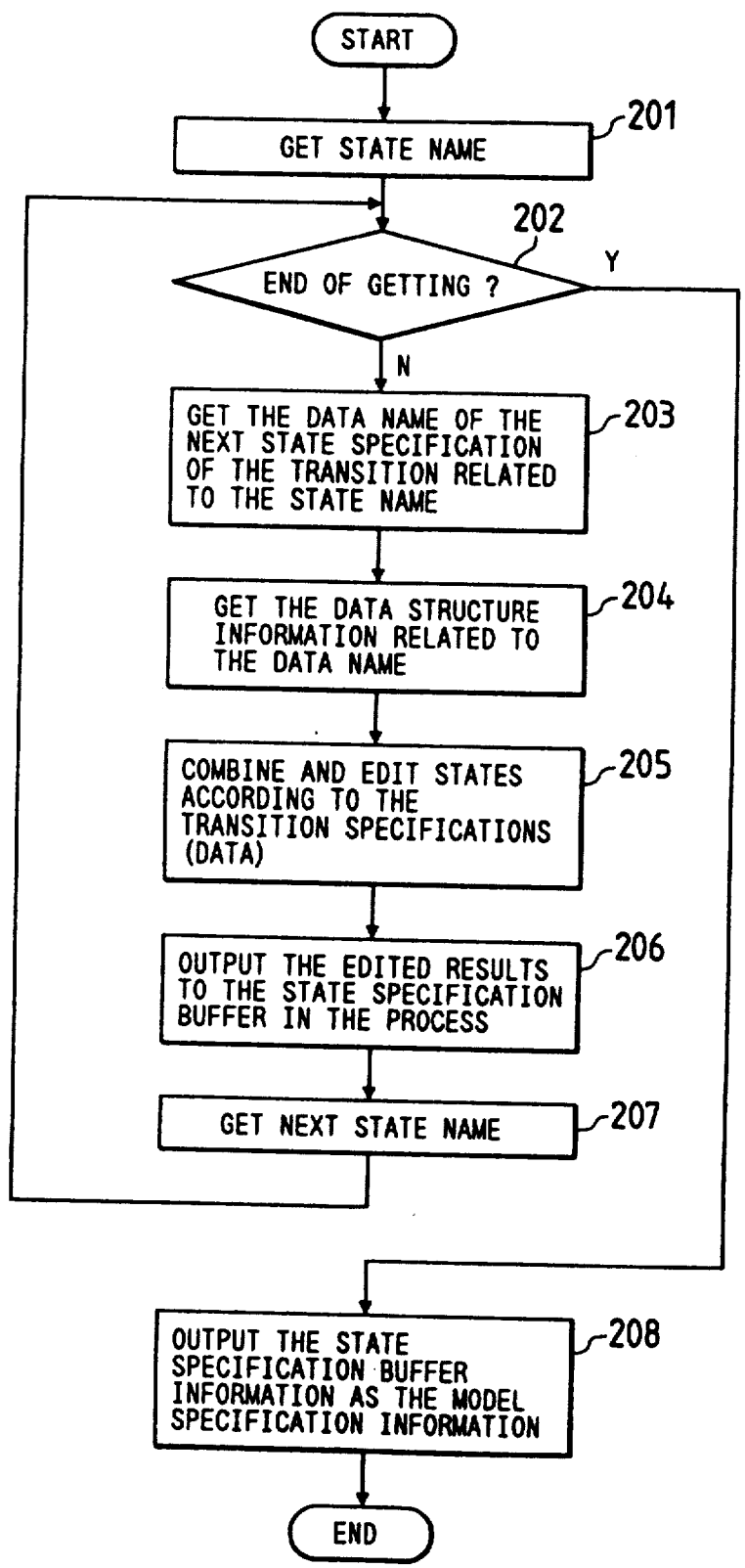

Subfigures (a) and (b) of FIG. 3 are flowcharts for helping to explain how the document output process 3 works. Below is a description of this process according to the flowcharts.

(1) Editing of process specifications

Design specifications (process name) are input from the design specification file in steps 101 and 110. The steps downstream of step 102 are repeated until the input information (input process names) has been exhausted in step 102. In step 103, the design specifications (receiver communication process specification, message name) related to the retrieved process name are input. In step 104, the design specifications related to the retrieved message name are input. If, in step 105, the process that was input in steps 101 and 110 is found to have a sub-process, design specifications (child process name) are input in step 106. In step 107, the design specifications of the child process name (communication attributes) are input. In step 108, given the information thus entered, the relations and dependencies between processes, between sub-processes, and between processes and sub-processes are combined and edited according to the communication attributes and error messages involved. The edited results are output, in step 109, to a process specification buffer of the process.

When the input process names have been exhausted in step 102, the information in the process specification buffer is output in step 111 as model specifications to the model specification file.

(2) Editing of state specifications

Design specifications (state name) are input from the design specification file in steps 201 and 207. The steps downstream of step 202 are repeated until the input information (input state names) has been exhausted. In step 203, the design specifications (next state specification, data name) related to the retrieved state name are input. In step 204, the design specifications (data structure information) related to the retrieved data name are input. Given the information thus entered, the relations between states are combined and edited in step 205 according to the transition specifications (data). The edited results are output in step 206 to a state specification buffer of the process. When the input states have been exhausted in step 202, the information in the state specification buffer is output in step 208 as model specifications to the model specification file.

The information that was output to the model specification file serves as an instruction word for use in outputting document information in formal description. FIG. 4 shows the instruction word in several different formats.

In FIG. 4, subfigure (a) shows an output window control instruction, (b) a window coordinate designation control instruction, (c) a linear display control instruction, (d) a circular display control instruction, (e) a polygonal display control instruction, and (f) character string display control instruction. In the subfigures (a) through (f), "FW," "FWM," "FWL," "FWC," "FWP" and "FWT" are mnemonic instruction codes. Other symbols will be described separately.

(1) The window control instruction defines the output area as a multi-window. The window size is designated by operand parts "Xnum" and "Ynum."

(2) The window coordinate designation control instruction is an instruction word that controls the output position in an output window. The position in the window is designated by the operand parts "Xnum" and "Ynum."

(3) The linear display control instruction is an instruction word that causes a straight line to be drawn between the coordinates designated by the operand parts "Xnum" and "Ynum." The line kind and the line thickness are designated respectively by operand parts "Kind" and "Ltype."

(4) The circular display control instruction is an instruction word that causes a circle to be drawn around the center designated by the operand parts "Xnum" and "Ynum," the radius of the circle being designated by an operand part "Rleng." The line kind and the line thickness are designated respectively by the operand parts "Kind" and "Ltype."

(5) The polygonal display control instruction is an instruction word that causes a polygon to be drawn with straight lines between the coordinates designated by the operand parts "Xnum" and "Ynum." The line kind and the line thickness are designated by the operand parts "Kind" and "Ltype," respectively.

(6) The character string display control instruction is an instruction word for outputting a character string in an operand part "Str" whose length is designated by an operand part "Chnum." The coordinates of the position to which the character string is output are designated by the operand parts "Xnum" and "Ynum."

Figure 5A:
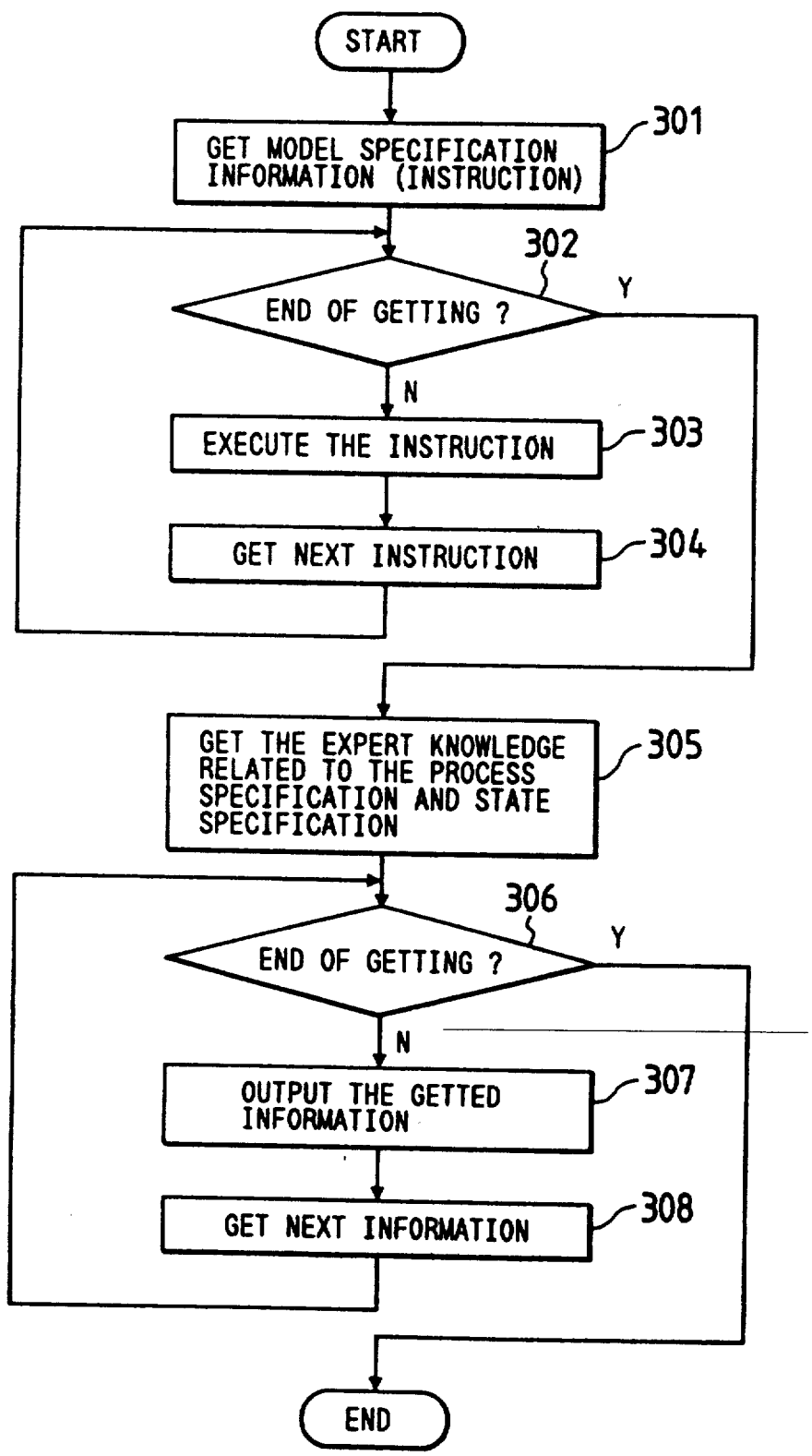

Subfigures (a) and (b) of FIG. 5 are flowcharts for helping to explain how the document output process 3 works. Below is a description of the operations of the process with reference to the subfigures.

In steps 301 and 304, model specifications (instruction word) are retrieved. Instruction execution continues until the instruction words to be retrieved have been exhausted in step 302. (The process and state specifications are output in formal description in step 303.) Then the expert knowledge regarding the process and state specifications is retrieved in steps 305 and 307. The expert knowledge is output in step 308 until the relevant information has been exhausted in step 306.

In steps 401 and 408, the expert knowledge regarding the object system is retrieved. Until the relevant information has been exhausted in step 402, and depending on the kind of information identified in step 403, terminology information is edited in step 404, system operation information is edited in step 406, or error recovery information is edited in step 407. The edited results are output in step 409 when the relevant information has been exhausted in step 402.

In the specification verifying process 4 of FIG. 1, the verifying information on design specifications stored in a file by the input process 1 is input and simulated. The verified results (i.e., log information collected during simulation) are output to an output device and to a file.

Below is a more detailed description of the specification verifying process 4. FIG. 18 is a set of views for helping to explain the principles of this process. Subfigure (a) shows how specifications are verified; subfigure (b) indicates the format of input information and an example thereof; subfigure (d) depicts the format in which to output state transition log information.

Of the symbols in subfigure (b) of FIG. 18, a colon ":" separates pieces of information, and a semicolon ";" separates information units. Subfigure (c) shows that a transition has resulted in the current state named S2, that the transition output information at the time is L2, and that the input of transition input information is awaited in response to the current state. Subfigure (e) of FIG. 18 shows state transition graphic information, representing the input text information (depicted in subfigure (b)) in graphic image. In subfigure (e), each enclosure ⬭ stands for a state and an arrow for a transition. The painted enclosure ⬤ indicates the current state. The rectangular area (□) at the bottom of the screen is the area where state transition input information is input, and state output information and messages are output. Subfigure (f) shows transition log graphic information, representing the transition log information of subfigure (d) in graphic image. The displays of subfigures (e) and (f) in FIG. 18 are output only when the graphic output format is selected on the menu screen.

As shown in subfigure (a) of FIG. 18, the specification verifying process 4 of this embodiment works as follows. State transition information (state kind, state name, transition condition, next state name of transition, transition output information) is first input. This state transition information is verified (i.e., simulated) in accordance with transition condition input information. As a result of this, state transition log information or transition log graphic information is output. As illustrated in subfigures (c) and (e) of FIG. 18, the state transition information is verified in text or graphic image.

There will now be described the state transition information and its components such as state kind, state name, transition condition, next state name of transition, and transition output information, as well as transition condition input information, transition log information, state transition graphic information, transition log graphic information, and transition information.

(1) State transition information

State transition information comprises a state kind, a state name, a transition condition, a next state name of transition, and transition output information.

(2) State kind

The state kind is one of three: an initial state (represented by "I"), an ongoing state (represented by "O"), or a final state (represented by "F"). An ongoing state is a state that occurs between the initial and the final state.

(3) State name

A state name is given so as to identify each state. Characters SX are used to represent the name in this example.

(4) Transition condition

A transition condition is a condition under which a transition occurs between states. This condition comprises <relational expression>, <numeric constant> and <character string constant>. In this example, characters CX are used to represent the condition.

(5) Next state name of transition

This is the name of the state following each transition. Characters SX are used to represent the next state name in this example.

(6) Transition output information

Transition output information is a body of output information that occurs concurrently with a state transition. Characters LX are used to represent the information in this example.

(7) Transition condition input information

Transition condition input information is a body of input information (values) corresponding to the transition information. This information is input interactively by referring to the current state.

(8) Transition log information

Transition log information is a body of information that represents the results of specification verification in list image.

(9) State transition graphic information

State transition graphic information is a body of information that represents the input state transition information in graphic image. The current state is indicated by ⬤ as it changes through transition. The rectangular area at the bottom of the screen is the area where transition condition input information is input, and transition output information and messages are output.

(10) Transition log graphic information

Transition log graphic information is a body of information that represents the results of specification verification in graphic image.

(11) Transition information

Transition information comprises a state number and a next state number of transition.

Figure 2:
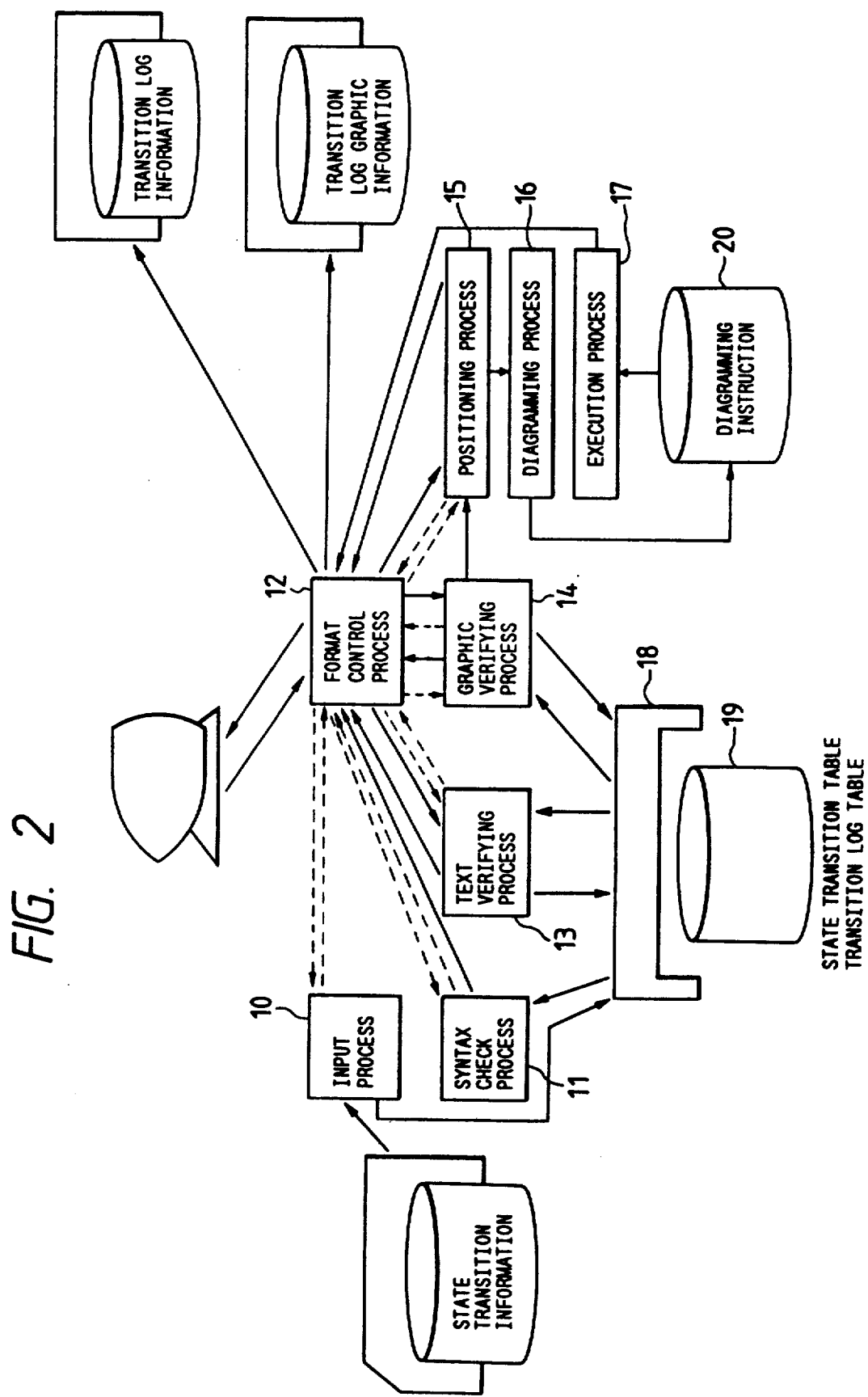
FIG. 2 is a functional diagram of a specification verifying process provided in the embodiment of the invention.

FIG. 2 is a functional diagram showing a specification verifying method embodying the specification verifying process according to the invention. As illustrated, the specification verifying method comprises a syntax check process 11, an input process 10, a format control process 12, a text verifying process 13, a graphic verifying process 14, a state transition information table access process 18, a positioning process 15, a diagramming process 16, and an execution process 17.

In the input process 10, state transition information (shown in subfigure (b) of FIG. 18) is input unit by unit.

The information is forwarded past the state transition information table access process 18 (in which a table access procedure, to be described later, is called) and into a state transition information table 19. The syntax check process 11 checks to see if the input state transition information contains any syntax error.

The format control process 12 controls the text verifying process 13 as well as the graphic verifying process 14. If a selection key is input in text image on the menu screen, the text verifying process 13 starts its verification. In this process, verification (i.e., simulation) continues throughout the transition between the initial and the final state while transition condition input information is being input. The verified results are output as transition log information (whose formats are shown in FIGS. 20 and 21) and stored in the transition log information table 19. If an error occurs during verification, the corresponding error message is output. The verifying process may be terminated depending on the severity of the error detected.

Figure 22:
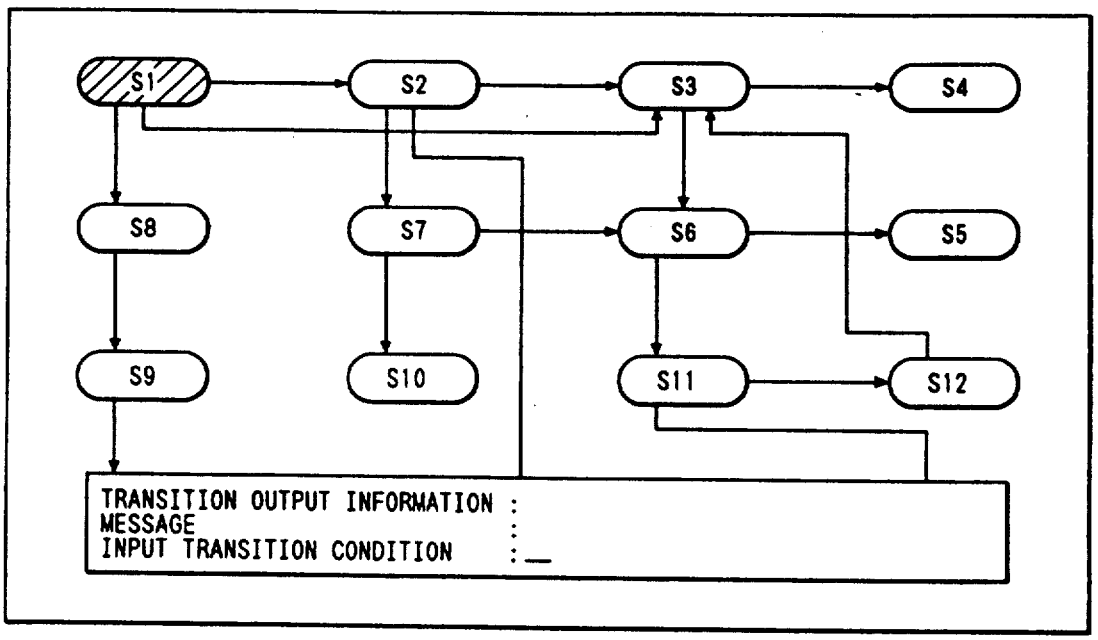
FIGS. 22 and 23 are views depicting graphic verification formats for use in the graphic verifying process.
Figure 23:
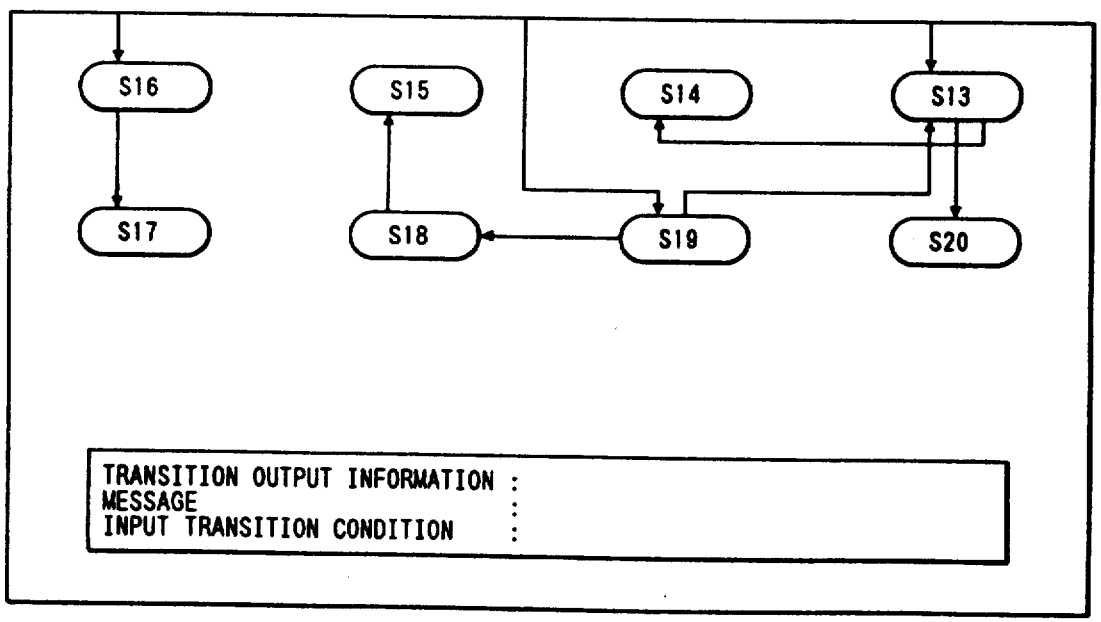
Figure 24:
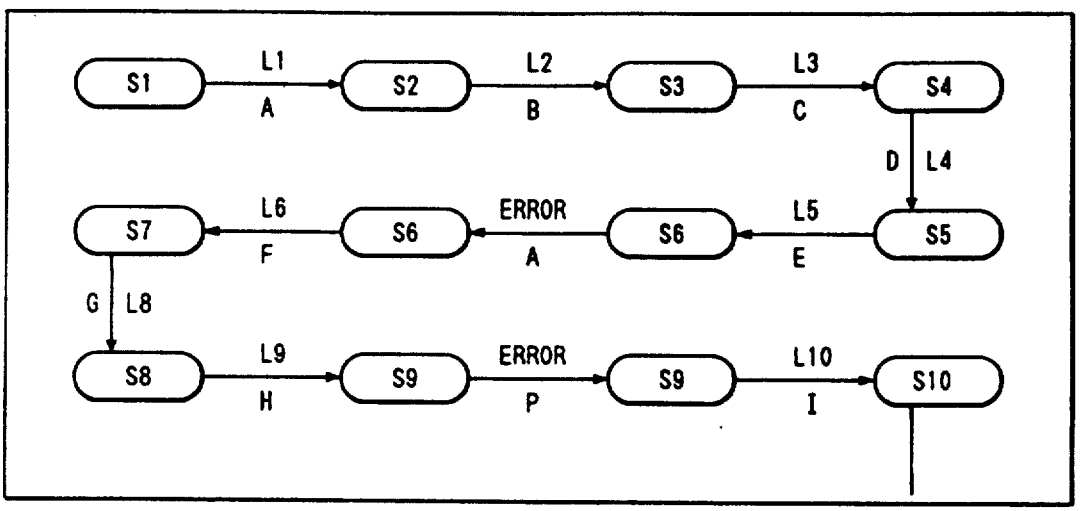
FIGS. 24 and 25 are views illustrating the format in which to output transition log graphic information during the graphic verifying process.
Figure 25:
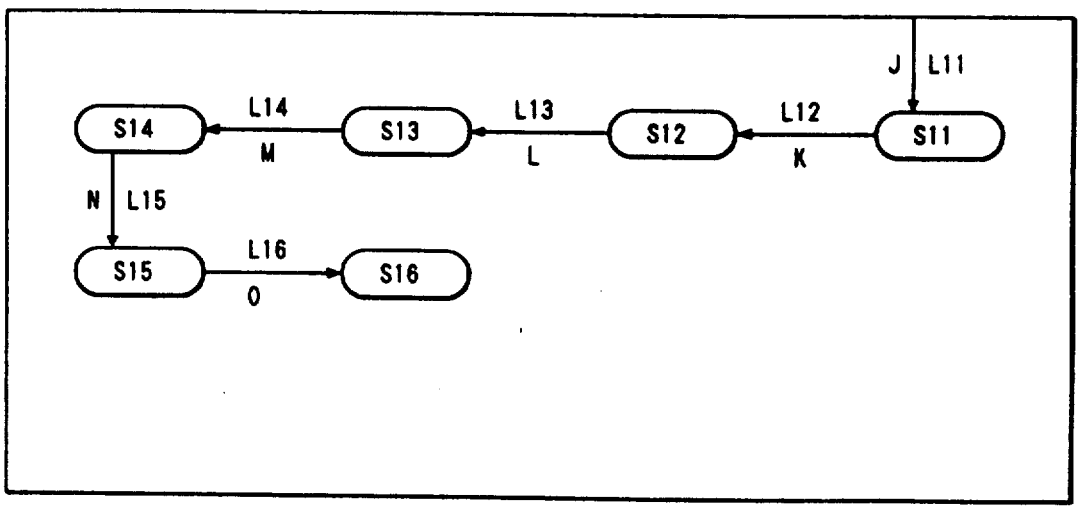

If a selection key is input in graphic image on the menu screen, the graphic verifying process 14 retrieves a state name, a state number and transition information from the state transition information table 19 (FIG. 17) for output to the positioning process 15. After receiving the state name, state number and transition information, the positioning process 15 prepares and outputs position information to the diagramming process 16. Given the position information, the diagramming process 16 stores a diagramming instruction in a file 20. In the execution process 17, the diagramming instruction is output as state transition graphic information, as shown in FIGS. 22 and 23. The graphic verifying process 14 outputs the number of the current state to the positioning process 15. With the current state number entered, the positioning process 15 outputs the position information to the diagramming process 15. In turn, the diagramming process, after receiving the position information, places the diagramming instruction in the file 20. The execution process 17 paints the current state on the screen with slashes or meshes. The transition condition input information is then admitted and output to the graphic verifying process 14. In turn, the graphic verifying process 14 verifies the transition condition input information that was admitted, and delivers a corresponding message or transition output information to the format control process 12. The format control process 12 outputs the message or transition output information. In addition, the state name, transition condition input information, transition condition output information and error number are retrieved from the transition log information table (shown in FIG. 17) for output as transition log graphic information (shown in FIGS. 24 and 25).

The state transition information table access process 18 writes and reads state transition information. Below is a description of the steps to verify the state transition information for the correctness of the specifications.

Step (1): input of state transition information

State transition information (state kind, state name, transition condition, next state name of transition, transition output) is input unit by unit. The information thus entered is forwarded in information units past the state transition information table access process 18 (in which a table access procedure, to be discussed later, is called) and into the state transition information table 19 (whose format will be described later).

Step (2): syntax check on state transition information

The state transition information is retrieved from the state transition information table 19 via the table access process 18 (in which a table access procedure, to be described later, is called) and is subjected to syntax check. If any syntax error is found in the information, a corresponding error message is output. Verification may be terminated depending on the severity of the error detected.

Step (3): verification of state transition information

The state transition information is verified by interactively inputting the transition condition input information.

(A) Text verification

Below are the steps to verify the state transition information in text image.

(1) An initial name is retrieved from the table and regarded as that of the current state. Then the current state name is output. The next step (2) is repeated until one of the following conditions is met:

(a) The final state is reached and there is no next state.

(b) In the final state, a "NO" response is returned in reply to the output message, "Want to continue verification?"

(2) When the transition condition coincides with the transition condition input information, the next state is regarded as the current state, and the current state name and the transition output information are output. The current state name, transition condition input information and transition output information are stored in the state transition log information table 19 (whose format will be described later). In case the transition condition fails to coincide with the transition condition input information, a message is output and verification is repeated.

(3) Output of transition log information

State names, transition condition input information, transition conditions, transition output information and error numbers are retrieved from the transition log information table for output in list image.

(B) Graphic verification

Below are the steps to verify the state transition information in graphic image for the correctness of the specifications.

When graphic-image verification is selected in the menu, the following steps (i) and (ii) are repeated, as shown in FIGS. 22 and 23. (A state transition information table access procedure will be described later.)

(i) Subordinate steps (1) through (3) below are repeated until all state names have been read from the state transition information table.

(1) A state name retrieval procedure, which is part of the state transition information table access procedure, is called.

(2) The position to which a state (◯) and its name are to be output is determined (in a manner which will be described later).

(3) The manner in which the state (◯) and its name are to be output will be described later.

(ii) The following subordinate steps (4) and (5) are repeated until all transition information has been read from the state transition information table.

(4) The transition information retrieval procedure, which is part of the state transition information table access procedure, is called.

(5) The position to which to output a transition (→) is determined.

(6) Each transition (→) is output in a manner which will be described later.

(iii) The state transition information is verified by interactively inputting the transition condition input information.

(1) An initial name is retrieved from the table and regarded as that of the current state. The current state is painted with slashes or meshes (in a manner which will be described later). Subordinate step (2) below is repeated until one of the following two conditions is met:

(a) The final state is reached and there is no next state.

(b) In the final state, a "NO" response is returned in reply to the output message, "Want to continue verification?"

(2) When the transition condition coincides with the transition condition input information, the next state of transition is regarded as the current state. The new current state is painted with slashes or meshes (⊂), whereas the painting of the previous current state (⊂) is removed. (The manner in which the painting is applied or removed will be described later.) Then transition output information is output. The current state name, transition condition input information, and transition output information are stored in the state transition log information table (whose format will be described later). In case the transition condition fails to coincide with the transition condition input information, a message is output (in a manner which will be described later) and verification is repeated.

(3) At the end of verification, the current state, transition condition, transition condition input information, and messages are stored in the state transition log information table (whose format will be described later).

(iv) Output of transition log graphic information (1) A state name is retrieved from the transition log information table.

(2) The position to which the state (⊂) and its name are to be output is determined.

(3) The state (⊂) and its name are output (in a manner will be described later). No output is effected if the error number is other than 0 (which means there exists an error).

(4) The error number, transition condition input information, transition condition, transition output and state number are retrieved from the transition log information table.

(5) If the error number is 0 (which means no error is present), then a transition (→), transition condition input information, and transition output information are output (in a manner which will be described later).

(6) If the error number is other than 0 (i.e., error present), the transition condition input information is output.

There will now be described the manner in which a state (⊂) and a transition (→) are output. The commands (1) through (8) in FIG. 15 are based on the basic commands shown in FIG. 16.

(1) Positioning

In FIG. 15, to find an item number (G) for format output from a state number (S), it is necessary to substitute the state number (S) in the expression (1). To find the position (X, Y) of the state number (S) involves substituting the state number (S) in the expression (2). To find the state position (m, n) in columns from the state position (X, Y), the state position is substituted in the expression (3).

(2) State output

The state position (m, n) in columns obtained in step (1) above is used as an argument by which to output a state, as shown in FIG. 15. In subfigure (b) of FIG. 27, up to eight lines may be used to connect transitions (→) to a single state. As illustrated, one state is divided into for areas, (o), (p), (q) and (r). If more than one transition is connected to the area (p) or (r), or if more than three transitions are connected to the area (o) or (q), the excess transitions involved are overlaid. The priorities of the overlapping transitions are numbered in subfigure (b) of FIG. 27, in which the smaller the number, the higher the priority it represents.

(3) Transition output (a) The state position (X, Y) obtained in (1) above and the position of the next state of transition (X', Y') are used to calculate, under the following conditions, the number of transition corners needed to output the transitions (→) involved:

Condition in effect when the number of corners is 0 (subfigure (c) of FIG. 27)

(1) When $(X'-X=0)$ and $(Y'-Y=1)$
(2) When $(X'-X=0)$ and $(Y'-Y=-1)$
(3) When $(Y'-Y=0)$ and $(X'-X=1)$
(4) When $(Y'-Y=0)$ and $(X'-X=-1)$ Condition in effect when the number of corners is 2 (subfigure (d) of FIG. 27)

(1) When $(Y'-Y=0)$ and $\{(X'-X=0)$ and except $(X'-X=+-1)\}$
(2) When $(Y'-Y=1)$ and $\{$except $(X'-X=0)\}$
(3) When $(Y'-Y=-1)$ and $\{$except $(X'-X=0)\}$ Condition in effect when the number of corners is 4 (subfigure (e) of FIG. 27)

(1) When $(X'-X=0)$ and $(Y'-Y=$ positive$)$
(2) When $(X'-X=0)$ and $(Y'-Y=$ negative$)$
(3) When (except $X'-X=1$) and $(X'-X=$ positive$)$ and (except $Y'-Y=1$) and $(Y'-Y=$ positive$)$
(4) When (except $X'-X=-1$) and $(X'-X=$ negative$)$ and (except $Y'-Y=-1$) and $(Y'-Y=$ negative$)$
(5) When (except $X'-X=1$) and $(X'-X=$ positive$)$ and (except $Y'-Y=-1$) and $(Y'-Y=$ negative$)$
(6) When (except $X'-X=-1$) and $(X'-X=$ negative$)$ and (except $Y'-Y=1$) and $(Y'-Y=$ positive$)$ (b) Given the number of transition (→) corners obtained in (a) above, the command (8) of FIG. 15 is used to output the transitions involved. If it is possible to output the transitions on a single screen using the command (8) of FIG. 15, the command group (a) in the figure is used; if it is impossible to output the transitions on one screen, the command group (b) is used. Below are the conditions according to which whether or not the transitions can be output on a single screen is determined.

Condition that does not permit single-screen output 0 < > number of format items for next state of transition (G') − number of format items for states involved (G)

Condition that permits single-screen output
0 = number of format items for next state of transition (G') − number of format items for states involved (G)

Meanwhile, the state transition information access process gains access to tables (described later) whose formats are shown in FIG. 17.

a) Procedure for storing state name and transition condition

A state name and a state kind are stored in the state table.

b) Procedure for storing transition condition and transition output information

A transition condition and transition output information are stored in the transition table.

c) Procedure for storing next state number of transition

A next state number of transition is stored in the "next state number of transition" field of the transition table.

d) Procedure for storing same state number of transition

Where there exist a plurality of next states following a state, the number of the field (index) containing the same state number is stored in the "same state name number of transition" field of the transition table.

e) Procedure for storing previous and next field linkage numbers

The numbers by which to link units of state transition information are stored in the "linkage number of previous field" and "linkage number of next field" of the transition table.

f) Procedure for storing transition log information

The current state, transition condition input information, transition condition, and transition output information in effect during specification verification are stored. Error numbers given to the errors that occurred are also stored.

g) Procedure for retrieving state name, state kind and transition table linkage number A state name, a state kind and a transition table linkage number are retrieved from the state table.

h) Procedure for retrieving state name number, transition condition and next state number of transition A state name number, a transition condition, a next state number of transition, transition output information, and the same state name number are retrieved from the transition table.

i) State name searching procedure

A state name provided as an argument is compared with the state names stored in the state table. If a matching name is found, the corresponding field number (index) is returned as the argument. If no matching name is found, zero (0) is returned.

j) Procedure for retrieving state name

A state name is retrieved from the state table.

k) Procedure for retrieving transition information

A state name number and a next state name number of transition are retrieved from the transition table.

There will now be described the table formats by referring to FIG. 17. In the state table illustrated, the "linkage number to transition table" field is a field by which to link the state table with the transition table. In the transition table, the "next state name number of transition" field is a field by which to go from one state to a plurality of states in transition. The "linkage number to previous field" and "linkage number to next field" are fields by which to link units of state transition information. In the transition log information table, the "error number" field is a field where error numbers are stored during specification verification.

The operations of each process will now be described in more detail by referring to FIGS. 10 through 15.

Figure 10:
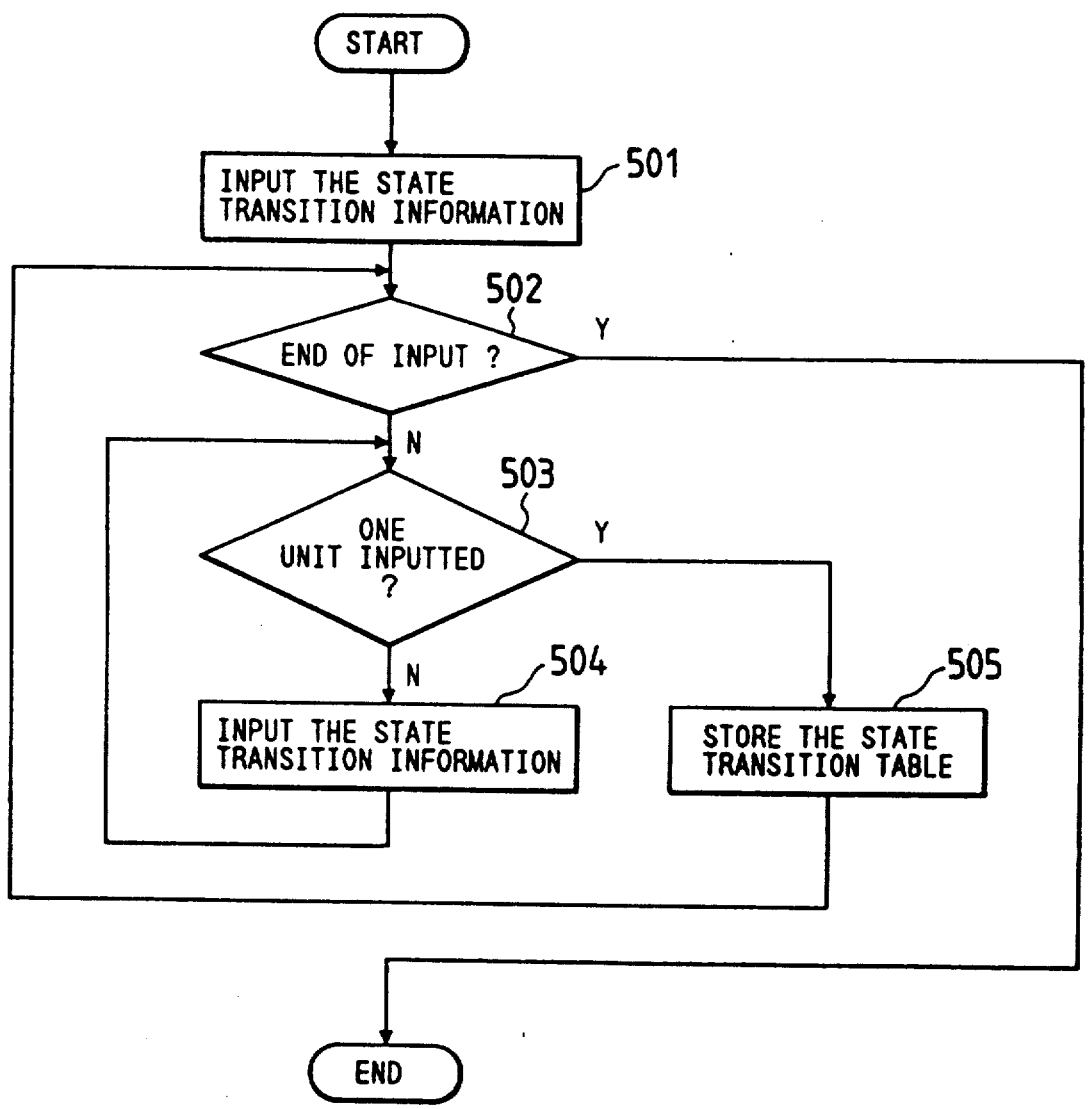
FIG. 10 is a flowchart depicting how an input process of the embodiment works.
Figure 11:
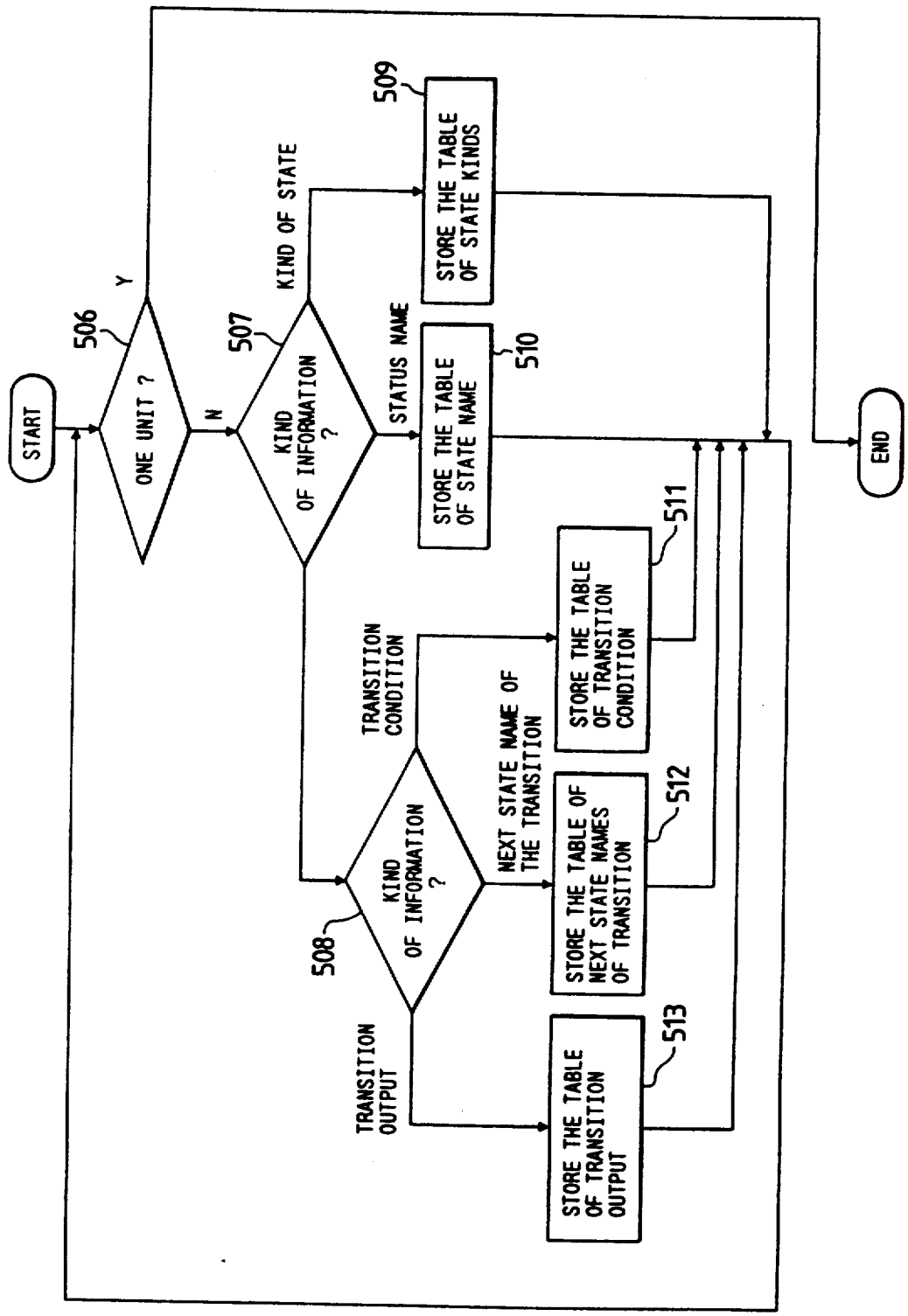
FIG. 11 is a flowchart illustrating how a table is set in the embodiment.

The operations of the input process 10 are described in detail with reference to the flowcharts in FIGS. 10 and 11. In steps 501 and 504, state transition information is input. In step 503, the input state transition information is placed unit by unit into the state transition information table, until the end of the input is reached in step 502.

More about the storing of the information in the table will be described with reference to FIG. 11. Before one unit of state transition information is stored in an appropriate table in step 506, the unit is judged in steps 507 and 508 to be a state kind, state name, transition condition, next state name of transition, or transition output.

After judgment, the unit is stored in steps 509 through 513 in the relevant table shown in FIG. 17.

Figure 12:
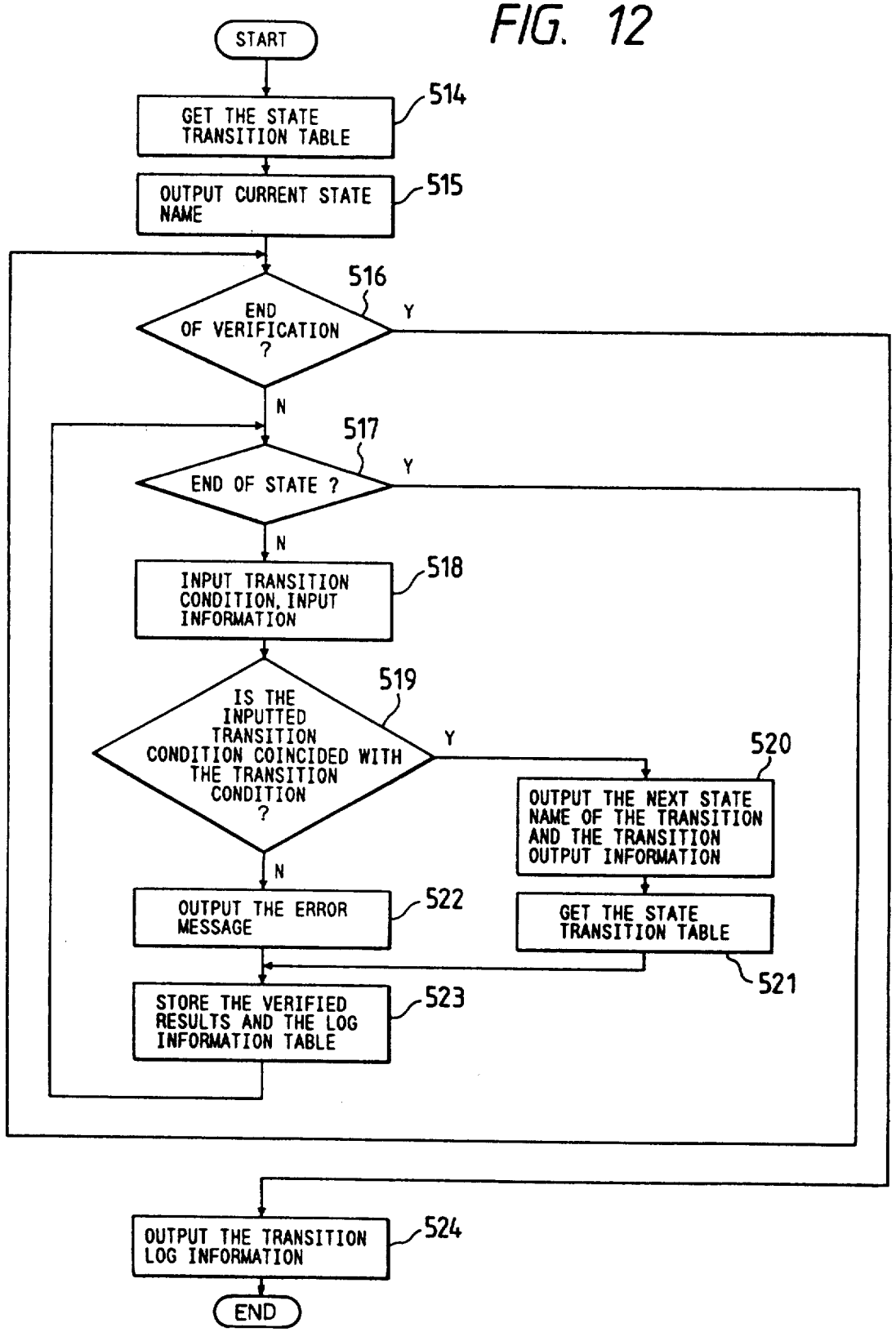
FIG. 12 is a flowchart describing how a text verifying process of the embodiment works.

The text verifying process 13 will now be described by referring to FIG. 12. One unit of state transition information is retrieved from the state transition information table in steps 514 and 521. In step 515, the current state name is output. If, in step 517, the current state is not judged to be the final state, transition condition input information is input in step 518. If the transition condition coincides with the transition condition input information in step 519, the next state name of transition and the transition output information are output in step 520. In steps 514 and 521, one unit of state transition information is retrieved from the state transition information table. The current state name, transition condition input information, transition output information, and error number are stored in the transition log information table in step 523. If the transition condition fails to coincide with the transition condition input information in step 519, an error message is output in step 522. The verified results are stored in the transition log information table in step 523. If the current state is judged to be the final state in step 517, and if the end of verification is reached in step 516, the transition log information is output in step 524, and the verifying process comes to an end.

Figure 14:
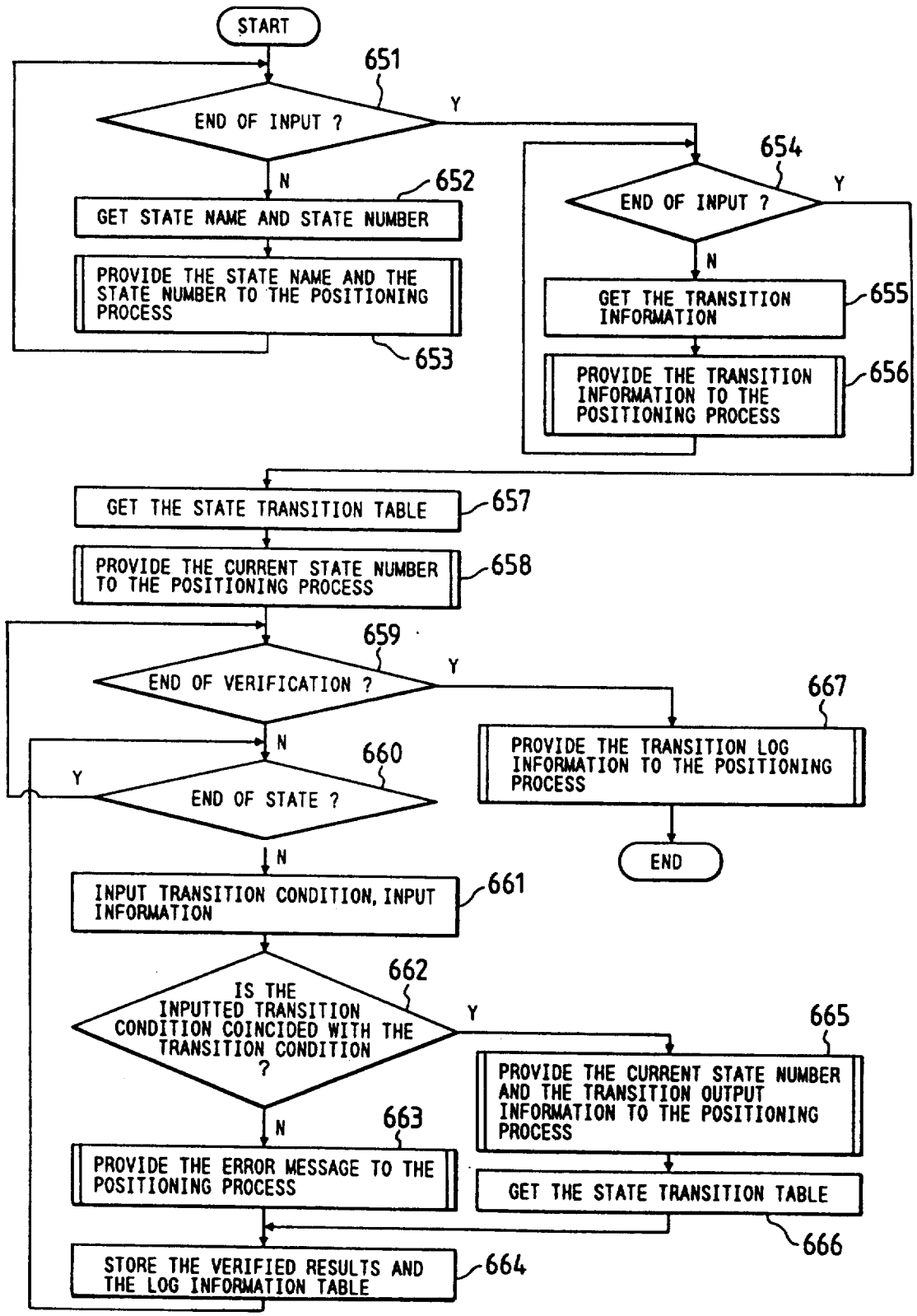
FIG. 14 is a flowchart depicting how a graphic verifying process of the embodiment works.
Figure 16A:
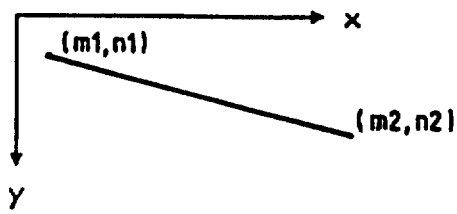
FIGS. 16(a), 16(b), 16(c), 16(d), 16(e) and 16(f) are views showing the formats of basic instructions used by the embodiment.
Figure 16B:
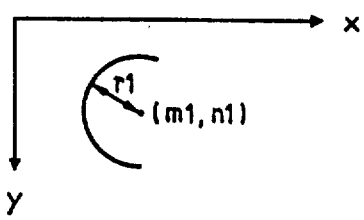
Figure 16C:
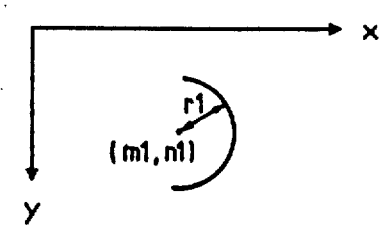
Figure 16D:
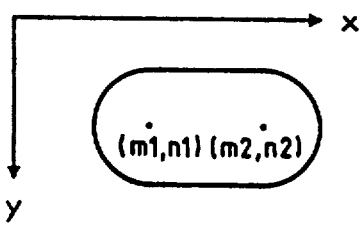
Figure 16E:
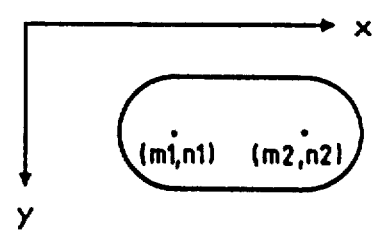
Figure 16F:
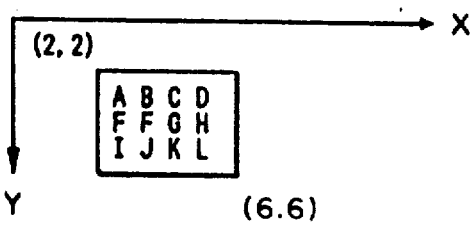

The graphic verifying process 14 will now be described by referring to FIG. 14. A state name and a state number are retrieved from the state transition information table in step 652 until the state name input comes to an end in step 651. In step 653, the positioning process 15 is called, and the state name and state number are delivered to that process. Transition information is retrieved from the state transition information table in step 655 until the retrieval of transition information comes to an end in step 654. In step 656, the positioning process 15 is called, and the transition information is delivered to that process. When the information retrieval is terminated in step 654, one unit of state transition information is retrieved from the state transition information table in steps 657 and 666. In step 658, the positioning process 15 is called, and the current state name is delivered to that process. If, in step 660, the current state is not judged to be the final state, transition condition input information is input in step 661. If the transition condition coincides with the transition condition input information in step 662, the positioning process 15 is called, and the current state number and transition output information are delivered to that process in step 665. In steps 657 and 666, one unit of state transition information is retrieved from the state transition information table. In step 664, the current state name, transition condition input information, transition condition, transition output information and error number are stored in the transition log information table. If the transition condition fails to coincide with the transition condition input information in step 662, the positioning process 15 is called, and the error message is delivered to that process in step 663. The verified results are stored in the transition log information table in step 664. If the current state is judged in step 660 to be the final state, and if the end of verification is reached in step 659, the positioning process 15 is called and the transition log information is delivered to that process in step 667. This terminates the verifying process.

Figure 13:
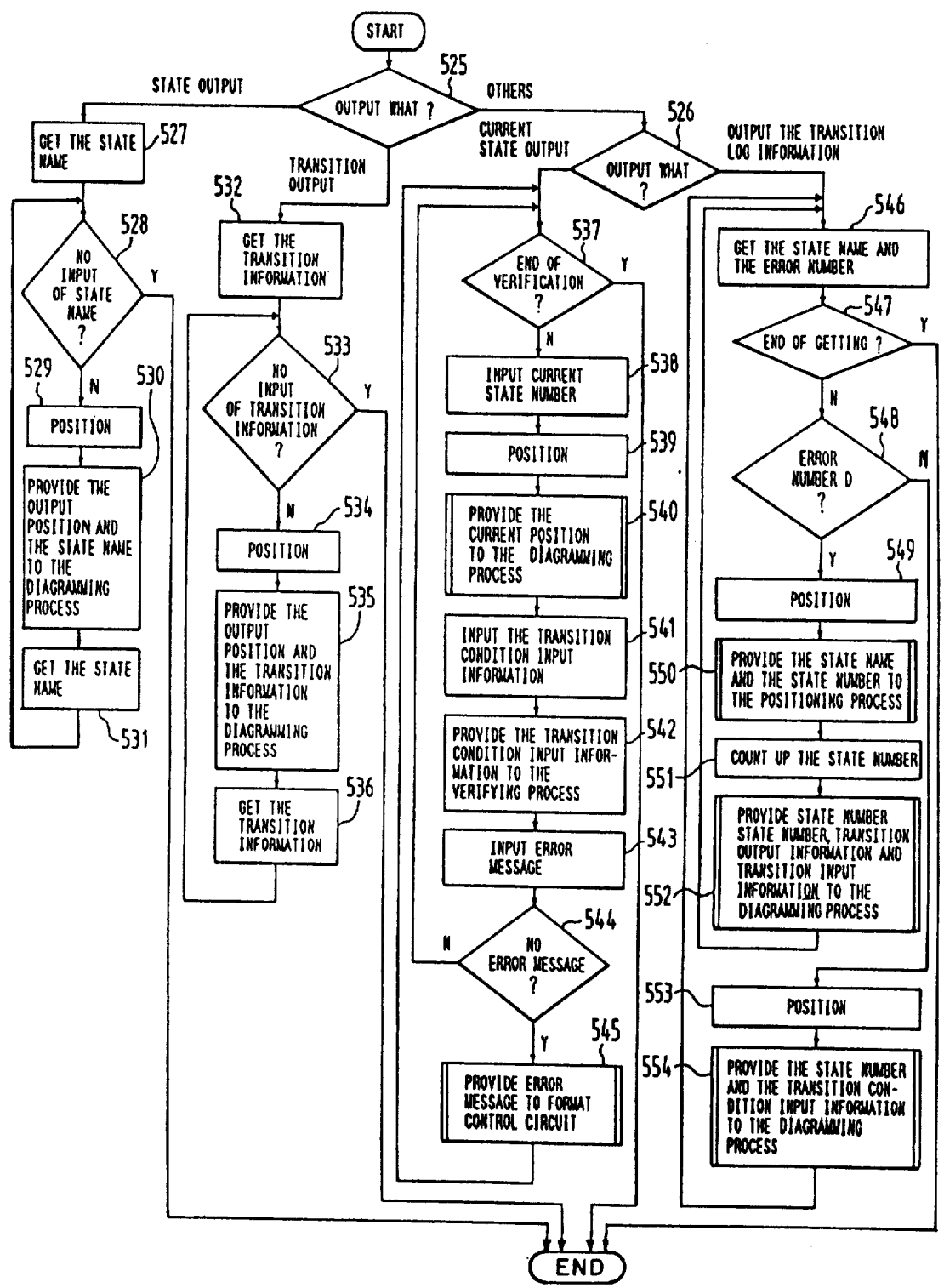
FIG. 13 is a flowchart showing how a positioning process of the embodiment works.

The positioning process 15 will now be described by referring to FIG. 13. The positioning method will be described later. In steps 525 and 526, what kind of information is to be output is determined. When state output is selected, a state name is retrieved in steps 527 and 531. Positioning is performed in step 529 until the state name input is terminated in step 528. In step 530, the diagramming process 16 is called, and the state name and output position are delivered to that process. In step 531, the state name is retrieved. When the state name input is terminated in step 528, the positioning process comes to an end. When transition output is selected, the transition information is retrieved in step 532. Positioning is performed in step 534 until the transition information input is terminated in step 533. In step 535, the output position and transition information are delivered to the diagramming process 16. In step 536, the transition information is retrieved. When the transition information input is terminated, the positioning process comes to an end. When current state output is selected, the current state is input from the verifying process in step 538 until the end of verification is reached in step 537. The position for output is determined in step 539. In step 540, the position to which to output the current state is delivered to the diagramming process 16. In step 541, the transition condition input information is input from the format control process 12. The transition condition input information thus accepted is delivered to the graphic verifying process 14 in step 542. An error message is input from the graphic verifying process 14 in step 543.

If an error message is judged to exist in step 544, the format control process 12 is called and the error message is delivered to that process in step 545. When the end of verification is reached in step 537, the positioning process is terminated. When transition log information output is selected, a state name and an error number are retrieved from the transition log table in step 546. The position allocated for output is determined in step 549 provided that the error number is judged to be 0 (i.e., error absent) in step 548, until the information retrieval comes to an end in step 547. In step 550, the state name and the output position are delivered to the diagramming process 16. In step 551, the state number is incremented by 1. In step 552, there is called the diagramming process 16 to which the output position, transition output information and transition condition input information are delivered. If the error number is judged to be other than 0 (i.e., error present) in step 548, the state number and transition condition input information are delivered to the diagramming process 16 in step 554. When the information retrieval comes to an end in step 547, the positioning process is terminated.

What follows is a further description of how positioning is carried out. To find an item number (G) for format output from a state (S), it is necessary to substitute the state number (S) in the expression (1) of FIG. 15. To find the position of the state number (X, Y) from the state number requires substituting the state number (S) in the expression (2). To find the state position (m, n) in columns from the state position (X, Y), the state position is substituted in the expression (3) of FIG. 15.

Figure 26:
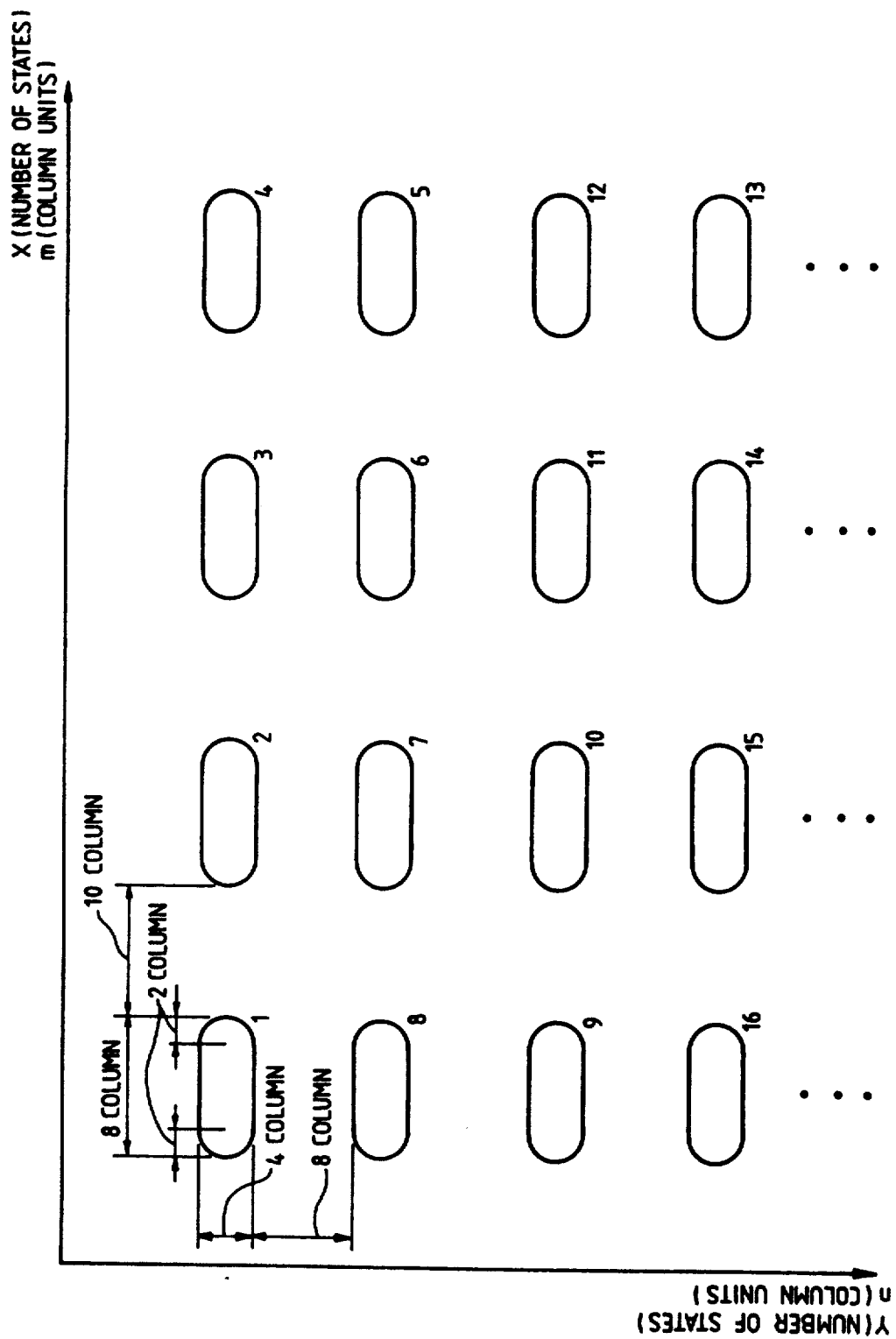
FIG. 26 is a view showing the format in which to output states.

There will now be described the diagramming process 15 by referring to the commands (4) through (8) of FIG. 15. In this figure, LINE, LCYCLE and RCYCLE are based on the basic commands shown in FIG. 16. The character S stands for a state number (as shown in FIG. 26), and G for a format item. Coordinates (X, Y) indicate a state reached by moving X states rightward and Y states downward with respect to the state numbered 1. Coordinates (m, n) indicate a position reached by moving m columns rightward and n columns downward with respect to the top right corner of an output file. The command (4) of FIG. 15 is used to output a state to the position (m, n). The command (5) is used to paint both ends of the state located at the position (m, n). The command (6) is used to delete the painting from the position (m, n). The command (7) is used to write an arrow for a transition to be output. The command group (a) of the command (8) is used to connect the state (m, n) and the next state (m', n') using a transition. The command group (b) is used to represent a transition between different formats.

The execution process 17 executes the basic commands that were established in the diagramming process 16. The basic commands will now be described by referring to FIG. 16. The LINE command (a) is used to connect a point having coordinates (m1, n1) with a point having coordinates (m2, n2) using a straight line. The LCYCLE command (b) is used to draw the left-hand half of a circle having a radius of r1 around the center having coordinates (m1, n1). The RCYCLE command (c) is used to draw the right-hand half of a circle having a radius of r1 around the center having coordinates (m1, n1). The PAINT command (d) is used to paint a state formed around two centers with coordinates (m1, n1) and (m2, n2). The DELETE command (e) is used to delete the painting from a state formed around two centers with coordinates (m1, n1) and (m2, n2). The WRITE command (f) is used to output characters within a designated range. If any character overflows the range, a line feed is carried out where needed. For example, where characters A through L are to be output between the range delimited by two positions with coordinates (2, 2) and (6, 6), the characters are output as shown under the heading of (f).

As described above, according to the present invention, design specifications are input and transformed into instruction words representing model specifications. The expert knowledge regarding the instruction words and design specifications allows document information to be prepared in formal description free of ambiguity and having a high level of understandability. Highly understandable document information helps improve communication (in the form of design reviews, etc.) among those who develop software and enhance the software maintainability. By additional input of the expert knowledge of a particular field to which the system under development belongs, it becomes possible to edit and output along with the document information the technical terms, system maintenance information, system operation information and error recovery information about the object system. The efficiency of processing is boosted by having the model specifications (i.e., instruction words) output the document information.

When the design specifications are transformed into verifiable information (i.e., information with feasibility) which is then simulated, the design specifications are verified for correctness. This feature improves the system reliability by alleviating the burdens on the testing stage.

What is claimed is:
1. A specification processing method for outputting documents in an information processing system, comprising the steps of:
  inputting design specification information containing a process specification, and a state transition specification;

storing said process specification and said state transition specification as verifying information to be simulated;

verifying said verifying information;

editing said process specification and said state transition specification into model specifications;

storing said model specifications as instruction words for use for document information output; and, outputting said document information according to instruction of said stored instruction words in connection with said design specification.

2. A specification processing method for outputting documents in an information processing system, comprising the steps of:

inputting design specification information as a process specification and a state transition specification;

storing said design specification as first information defining relations among processes in said process specification, and as second information defining relations among states in said state transition specification;

verifying said process and state specification in a text image;

verifying said process and state specification in a graphic image;

generating a command set for outputting a diagrammatical document in accordance with said process and state transition specifications; and, editing said diagrammatical document as an edited document and outputting said edited document by executing said command set in connection with said design specification information.

3. The specification processing method according to claim 2, further comprising the steps of:

determining a position to effect graphic output for said diagrammatical document;

generating diagramming commands for accomplishing graphic diagramming in accordance with the information on said position and with said command set;

storing said diagramming commands generated in the generating step; and, executing said diagramming commands stored in said storing step.

* * * * *